United States Patent
Seol et al.

(10) Patent No.: US 9,164,881 B2
(45) Date of Patent: Oct. 20, 2015

(54) METHOD OF DETERMINING DETERIORATION STATE OF MEMORY DEVICE AND MEMORY SYSTEM USING THE SAME

(71) Applicant: SAMSUNG ELECTRONICS CO., LTD., Suwon-Si, Gyeonggi-Do (KR)

(72) Inventors: Chang-Kyu Seol, Osan-Si (KR); Jun-Jin Kong, Yongin-Si (KR); Hong-Rak Son, Anyang-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 43 days.

(21) Appl. No.: 14/052,801

(22) Filed: Oct. 14, 2013

(65) Prior Publication Data

US 2014/0108747 A1    Apr. 17, 2014

(30) Foreign Application Priority Data

Oct. 17, 2012    (KR) .................. 10-2012-0115486

(51) Int. Cl.
*G06F 3/00* (2006.01)
*G06F 13/00* (2006.01)
(Continued)

(52) U.S. Cl.
CPC ............. *G06F 12/00* (2013.01); *G06F 11/00* (2013.01); *G11C 16/349* (2013.01); *G11C 29/00* (2013.01); *G11C 29/50004* (2013.01); *G06F 11/1048* (2013.01); *G06F 11/3466* (2013.01); *G11C 11/5628* (2013.01); *G11C 11/5642* (2013.01); *G11C 16/26* (2013.01); *G11C 16/3418* (2013.01); *G11C 16/3422* (2013.01); *G11C 16/3427* (2013.01); *G11C 2029/0409* (2013.01)

(58) Field of Classification Search
CPC . G06F 11/00; G06F 11/1048; G06F 11/3466; G06F 12/00; G11C 11/5628; G11C 11/5642; G11C 16/26; G11C 16/3418; G11C 16/3422; G11C 16/3427
See application file for complete search history.

(56) References Cited

U.S. PATENT DOCUMENTS 5,768,193 A * 6/1998 Lee et al. .................. 365/185.25
5,867,429 A    2/1999 Chen et al.
(Continued)

FOREIGN PATENT DOCUMENTS

JP    2011100519    5/2011

*Primary Examiner* — Henry Tsai
*Assistant Examiner* — Jing-Yih Shyu
(74) *Attorney, Agent, or Firm* — Volentine & Whitt, PLLC

(57) ABSTRACT

A method is provided for determining a deterioration condition of a memory device. The method includes calculating first information corresponding to a number of bits having a first logic value from data obtained by performing a first read operation on target storage region of the memory device using a first reference voltage as a read voltage, and calculating second information corresponding to a number of bits having a second logic value from data obtained by performing a second read operation on the target storage region using a second reference voltage as the read voltage. A deterioration condition of the target storage region is determined based on the first and second information. The first reference voltage is less than a first read voltage by which an erase state of the memory device is distinguished from an adjacent program state, and the second reference voltage is higher than the first read voltage.

17 Claims, 25 Drawing Sheets

(51) Int. Cl.
  *G06F 12/00* (2006.01)
  *G06F 11/00* (2006.01)
  *G11C 29/00* (2006.01)
  *G11C 29/50* (2006.01)
  *G06F 11/10* (2006.01)
  *G11C 16/34* (2006.01)
  *G11C 11/56* (2006.01)
  *G06F 11/34* (2006.01)
  *G11C 16/26* (2006.01)
  *G11C 29/04* (2006.01)

(56) References Cited

U.S. PATENT DOCUMENTS

| | | | |
|---|---|---|---|
| 7,778,078 | B2 | 8/2010 | Nagadomi et al. |
| 2005/0162913 | A1 | 7/2005 | Chen |
| 2008/0215954 | A1 | 9/2008 | Oshikiri |
| 2009/0027960 | A1* | 1/2009 | Sarin et al. ............... 365/185.03 |
| 2009/0323412 | A1 | 12/2009 | Mokhlesi et al. |
| 2010/0131809 | A1* | 5/2010 | Katz ............................ 714/719 |
| 2010/0265764 | A1* | 10/2010 | Yoo et al. ................. 365/185.02 |
| 2012/0268994 | A1* | 10/2012 | Nagashima .............. 365/185.11 |

\* cited by examiner

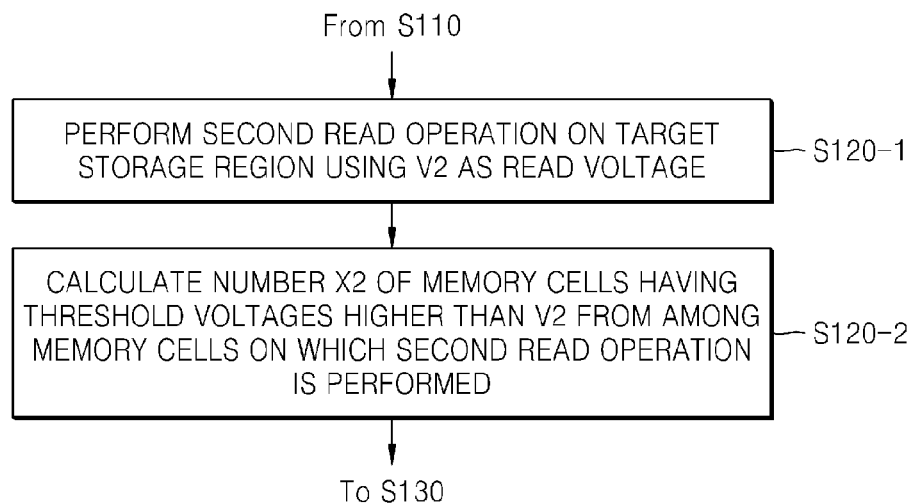
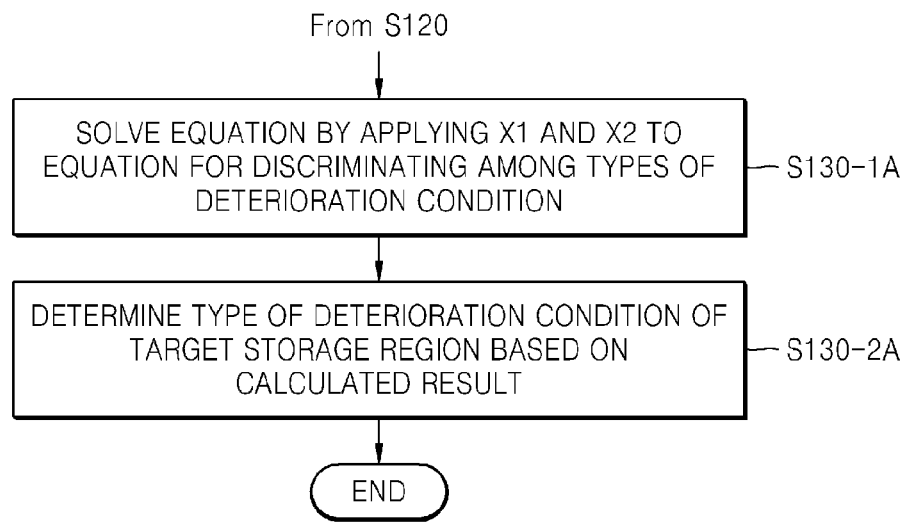

METHOD OF DETERMINING DETERIORATION STATE OF MEMORY DEVICE AND MEMORY SYSTEM USING THE SAME

CROSS-REFERENCE TO RELATED APPLICATION

A claim for priority under 35 U.S.C. §119 is made to Korean Patent Application No. 10-2012-0115486, filed on Oct. 17, 2012, in the Korean Intellectual Property Office, the entire contents of which are hereby incorporated by reference.

BACKGROUND

The inventive concept relates to a memory device and a method of controlling the same, and more particularly, to a method of determining a deterioration state of a memory device and a memory system using the same.

Memory devices used to store data may be classified as volatile memory devices or nonvolatile memory devices. Properties of a memory device may vary according to its environment, the number of times the memory device is used, and an elapsed time. Accordingly, a technique of determining the exact type of deterioration condition of the memory device would improve reliability of the memory device.

SUMMARY

The inventive concept is directed to a method of determining a deterioration condition of a memory device to discriminate between types of deterioration conditions of the memory device. The inventive concept also is directed to a memory system configured to discriminate between types of deterioration conditions of a memory device.

According to an aspect of the inventive concept, there is provided a method of determining a deterioration condition of a memory device. The method includes calculating first information corresponding to a number of bits having a first logic value from data obtained by performing a first read operation on a target storage region of the memory device using a first reference voltage as a read voltage; calculating second information corresponding to a number of bits having a second logic value, from data obtained by performing a second read operation on the target storage region of the memory device using a second reference voltage as the read voltage; and determining a deterioration condition of the target storage region of the memory device based on the calculated first information and the calculated second information. The first reference voltage is less than a first read voltage by which an erase state of the memory device is distinguished from a program state adjacent to the erase state, and the second reference voltage is higher than the first read voltage.

The calculation of the first information may include performing the first read operation on the target storage region using the first reference voltage as the read voltage, and calculating a number of memory cells having threshold voltages less than or equal to the first reference voltage among memory cells of the target storage region on which the first read operation is performed.

The calculation of the second information may include performing the second read operation on the target storage region using the second reference voltage as the read voltage, and calculating a number of memory cells having threshold voltages higher than the second reference voltage among memory cells of the target storage region on which the second read operation is performed.

Based on distribution of initial threshold voltages of memory cells of the memory device, the first reference voltage may be determined to be a median value of a distribution of threshold voltages obtained in the erase state, and the second reference voltage may be determined to be a median value of a distribution of threshold voltages obtained in a program state having a highest threshold voltage from among multiple program states.

The determination of the deterioration condition may include applying the calculated first information and the calculated second information to a predetermined equation and performing a calculation process; and determining the type of deterioration condition of the target storage region of the memory device based on a result of the calculation process. The predetermined equation may be obtained to discriminate among the types of deterioration conditions based on a distribution of experimentally measured first information and experimentally measured second information.

The predetermined equation may be obtained to discriminate a first type of deterioration condition, in which a distribution of threshold voltages obtained in the erase state of the memory device moves toward a higher voltage, from a second type of deterioration condition, in which a distribution of threshold voltages obtained in at least one program state of the memory device moves toward a lower voltage.

The second type of deterioration condition may include a deterioration condition in which a distribution of threshold voltages obtained in a program state having a highest threshold voltage, from among multiple program states of the memory device including multi-level cells, moves toward the lower voltage.

The predetermined equation may be obtained to discriminate among types of deterioration conditions based on a support vector machine algorithm in a distribution chart of the experimentally measured first information and the experimentally measured second information.

The predetermined equation may use the experimentally measured first information and the experimentally measured second information as respective variables and discriminate among at least two types of deterioration conditions based on the experimentally measured first information and the experimentally measured second information.

The target storage region of the memory device may include a storage region that has failed in correcting errors during a data read process.

According to another aspect of the inventive concept, there is provided a memory system including a memory device and a memory controller. The memory device includes memory cells having an erase state and at least one program state. The memory controller is configured to apply each of a first reference voltage and a second reference voltage as a read voltage and to determine a type of deterioration condition of a target storage region of the memory device based on a number of bits having a first logic value and a number of bits having a second logic value that are included in data read from the target storage region of the memory device. The applied first reference voltage is set less than a first read voltage for discriminating between the erase state and a program state adjacent to the erase state, and the second reference voltage is set higher than the first read voltage.

The memory controller may include a read voltage controller configured to determine usage of the first reference voltage or the second reference voltage as the read voltage under initialized conditions and to apply the read voltage to the memory device, and a memory state determiner configured to determine the type of the deterioration condition of the target storage region of the memory device based on the number of bits having the first logic value included in data read from the target storage region using the first reference voltage, and the number of bits having the second logic value included in data read from the target storage region using the second reference voltage.

The memory state determiner may include a first counter configured to count the number of the bits having the first logic value included in the data read from the target storage region when applying the first reference voltage as the read voltage; a second counter configured to count the number of the bits having the second logic value included in the data read from the target storage region when applying the second reference voltage as the read voltage; a calculator configured to apply first information obtained by the first counter and second information obtained by the second counter and to solve a predetermined equation, initialized to discriminate among types of deterioration conditions of the memory device, using the first information and the second information; and a deterioration type determiner configured to determine the type of deterioration condition of the target storage region based on the solution obtained by the calculator.

The memory controller may perform a reliability recovery process corresponding to the determined type of deterioration condition of the target storage region of the memory device. The reliability recovery process may include transferring data stored in the target storage region of the memory device to another storage region of the memory device when the determined type of deterioration condition is a state in which a distribution of threshold voltages obtained in the erase state moves toward a higher voltage, and the reliability recovery process may include applying an initialized program stress voltage to a word line corresponding to the target storage region of the memory device when the determined type of deterioration condition is a state in which a distribution of threshold voltages obtained in a program state of the target storage region of the memory device moves toward a lower voltage.

According to another aspect of the inventive concept, there is provided a method of determining a deterioration condition of a memory device. The method includes performing a first read operation on a target storage region of the memory device using a first reference voltage as a read voltage, the first reference voltage being less than a first read voltage required to distinguish an erase state of the memory device from a program state adjacent to the erase state; counting a number of bits having a first logic value from the first read operation to determine first information; performing a second read operation on the target storage region of the memory device using a second reference voltage as the read voltage, the second reference voltage being higher than the first read voltage; counting a number of bits having a second logic value from the second read operation to determine second information; and applying the first and second information to a predetermined equation and solving the predetermined equation to determine a deterioration condition of the target storage region of the memory device.

BRIEF DESCRIPTION OF THE DRAWINGS

Exemplary embodiments of the inventive concept will be more clearly understood from the following detailed description taken in conjunction with the accompanying drawings, in which:

FIG. 15 is a detailed flowchart of operation S120 of calculating the second information shown in FIG. 13, according to an exemplary embodiment of the inventive concept;

FIG. 16 is a detailed flowchart illustrating operation S130 of determining a deterioration condition shown in FIG. 13, according to an exemplary embodiment of the inventive concept;

DETAILED DESCRIPTION OF THE EMBODIMENTS

Figure 1:
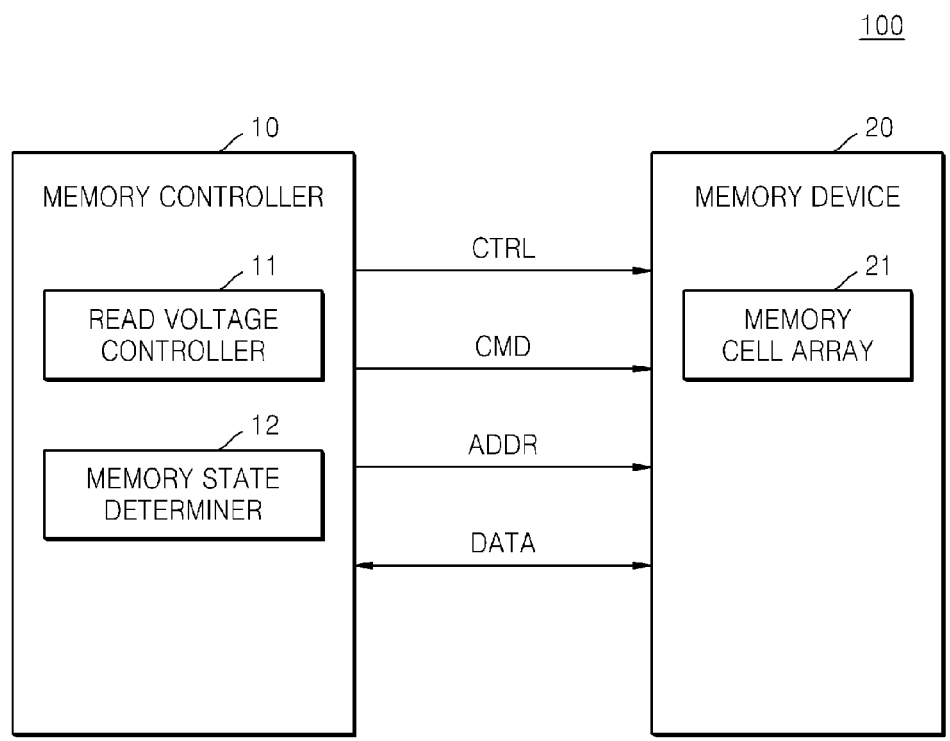
FIG. 1 is a schematic block diagram of a memory system, according to an exemplary embodiment of the inventive concept.

The inventive concept will now be described more fully hereinafter with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to one of ordinary skill in the art. Thus, exemplary embodiments are described below in sufficient detail to enable those of ordinary skill in the art to embody and practice the inventive concept. While the inventive concept can be modified in various ways and take on various alternative forms, specific embodiments thereof are shown in the drawings and described in detail below as examples. There is no intent to limit the inventive concept to the particular forms disclosed. On the contrary, the inventive concept is to cover all modifications, equivalents, and alternatives falling within the spirit and scope of the appended claims. Elements of the exemplary embodiments are consistently denoted by the same reference numerals throughout the drawings and detailed description. In the drawings, the sizes of layers and regions may be exaggerated for clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "exemplary" refers to an example or illustration.

FIG. 1 is a schematic block diagram of a memory system, according to an exemplary embodiment of the inventive concept.

Referring to FIG. 1, memory system 100 includes a memory controller 10 and a memory device 20. The memory controller 10 performs control operations on the memory device 20. Specifically, the memory controller 10 may transmit an address ADDR, a command CMD, and a control signal CTRL to the memory device 20 and may control program (or write), read, and erase operations of the memory device 20. Hereinafter, components included in the memory controller 10 and the memory device 20 will be described in detail.

The memory device 20 includes a memory cell array 21, which includes a plurality of memory cells disposed at intersections between a plurality of word lines and a plurality of bit lines. In an embodiment, the memory cells may be flash memory cells, and the memory cell array 21 may be a NAND flash memory cell array or a NOR flash memory cell array. Hereinafter, exemplary embodiments of the inventive concept will be described on assumption that the memory cells are flash memory cells, for purposes of illustration. However, the inventive concept is not limited thereto. In another embodiment, the memory cells may be resistive memory cells, such as resistive random access memory (RRAM) memory cells, phase-change RAM (PRAM) memory cells, or magnetic RAM (MRAM) memory cells, for example.

The memory controller 10 includes a read voltage controller 11 and a memory state determiner 12. Thus, the memory controller 10 is able to control a voltage level of a read voltage required to read data from the memory cells, output the controlled read voltage, and control the memory device 20. Hereinafter, components included in the memory controller 10 will be described in detail.

The memory state determiner 12 determines a deterioration condition of the memory device 20 caused by movement of an erase state or a program state based on an initial distribution of threshold voltages of memory cells of the memory device 20. In an example, the memory state determiner 12 applies a first reference voltage V1 and a second reference voltage V2 as read voltages, respectively, and determines a deterioration condition of a target storage region of the memory device 20 based on first information X1 (e.g., the number of bits having a first logic value) or second information X2 (e.g., the number of bits having a second logic value), which are included in data read from the target storage region of the memory device 20. Here, the first reference voltage V1 is set less than a first read voltage required to distinguish an erase state of the memory device 20 from a program state adjacent to the erase state, and the second reference voltage V2 is set higher than the first read voltage. The first and second reference voltages V1 and V2, which are read voltages used to determine the memory state, may be stored in the memory system 100. The first and second reference voltages V1 and V2 may be stored in the memory device 20 or the memory controller 10.

In an example, when an error correction failure state occurs during a read operation, the memory state determiner 12 identifies the word line WL or block BLK, in which the error correction failure state occurs, as a target storage region.

In an example, based on the distribution of initial threshold voltages of the memory cells of the memory device 20, the first reference voltage V1 may be determined as a median value of the distribution of threshold voltages obtained in the erase state, while the second reference voltage V2 may be determined as a median value of the distribution of threshold voltages obtained in the most significant program state. In this case, the number X1 of memory cells having threshold voltages less than the first reference voltage V1 is about ½ the number of all memory cells put into the erase state. Also, the number X2 of memory cells having threshold voltages higher than the second reference voltage V2 is about ½ the number of all memory cells put into the most significant program state. Furthermore, in the case of an initial distribution, the number X1 may be equal or similar to the number X2.

In another example, based on the distribution of initial threshold voltages of the memory cells of the memory device 20, the first reference voltage V1 may be determined as a median value of the distribution of threshold voltages obtained in the erase state, while the second reference voltage V2 may be determined as a median value of the distribution of threshold voltages obtained in any one of multiple program states.

In another example, based on the distribution of initial threshold voltages of the memory cells of the memory device 20, the first reference voltage V1 may be determined as an arbitrary voltage within a range initialized on the basis of a median value of the distribution of threshold voltages obtained in the erase state, while the second reference voltage V2 may be determined as an arbitrary voltage within a range initialized on the basis of a median value of the distribution of threshold voltages obtained in any one of a plurality of program states.

In an example, the memory state determiner 12 may apply the first reference voltage V1 as a read voltage and calculate first information X1 as the number of memory cells having threshold voltages less than or equal to the first reference voltage V1, from among memory cells that have performed a first read operation on at least one page of the memory device 20. The memory state determiner 12 may apply the second reference voltage V2 as a read voltage and calculate second information X2 as the number of memory cells having threshold voltages higher than the second reference voltage V2, from among memory cells that have performed a second read operation on at least one page of the memory device 20.

In an example, the memory state determiner 12 may determine a deterioration condition of the target storage region of the memory device 20 based on the number of the bits having the first logic value (first information X1), which are included in data read from the target storage region of the memory device 20 using the first reference voltage V1, and the number of the bits having the second logic value (second information X2) included in data read from the target storage region of the memory device 20 using the second reference voltage V2. Here, a bit value read from a memory cell having a threshold voltage less than or equal to the first reference voltage V1, from among memory cells that have performed the first read operation, has a first logic value. Therefore, the number of memory cells having a threshold voltage less than or equal to the first reference voltage V1 may be determined by counting the number (X1) of bits having the first logic value. Likewise, a bit value read from a memory cell having a threshold voltage higher than the second reference voltage V2, from among memory cells that have performed the second read operation, has a second logic value. Therefore, the number of memory cells having a threshold voltage greater than the second reference voltage V2 may be determined by counting the number (X2) of bits having the second logic value.

Therefore, in an example, the memory state determiner 12 counts the number of bits "1" stored in a page buffer (refer to page buffer 25 in FIG. 2) of the memory device 20 after a read operation is performed using the first reference voltage V1 and determines the first information X1. Also, the memory state determiner 12 counts the number of bits "0" stored in the page buffer 25 of the memory device 20 after a read operation is performed using the second reference voltage V2, and determines the second information X2.

In an example, the memory state determiner 12 may apply the first information X1 and the second information X2, determined by the read operations using the first and second reference voltages V1 and V2, to a predetermined equation, and determine the type of deterioration condition of the target storage region of the memory device 20 based on the results of solving the equation. The predetermined equation may be determined to discriminate among different types of deterioration conditions based on the distribution of the experimentally obtained first and second information X1 and X2.

For example, the predetermined equation may distinguish between a first type of deterioration condition and a second type of deterioration condition. The first type of deterioration condition refers to a state in which the distribution of the threshold voltages obtained in the erase state of the memory device 20 moves toward a higher voltage. The second type of deterioration condition refers to a state in which the distribution of the threshold voltages obtained in at least one program state of the memory device 20 moves toward a lower voltage. For example, the first type of deterioration condition may occur due to read disturbance, while the second type of deterioration condition may occur due to charge loss.

In an example, the predetermined equation may discriminate among types of deterioration conditions based on a support vector machine algorithm in a distribution chart of the experimentally obtained first and second information X1 and X2. Here, the second type of deterioration condition may include a deterioration condition in which the distribution of threshold voltages obtained in a program state having the highest threshold voltage, from among the multiple program states, moves toward a lower voltage in the memory device 20 including multi-level cells.

The read voltage controller 11 controls the voltage level of the read voltage required to read the memory device 20, that is, read data stored in memory cells disposed in the memory cell array 21, based on data DATA received from the memory device 20. In this case, an output of the read voltage controller 11 is transmitted as a control signal CTRL to the memory device 20. Thus, the memory controller 10 includes the read voltage controller 11 and applies the first and second reference voltages V1 and V2, which are required to determine the deterioration condition of the memory device 20, as read voltages to the memory device 20.

For example, the read voltage controller 11 may generate an initialized read voltage and apply the initialized read voltage to the memory device 20 during a period in which a normal data read operation is performed. When a memory cell MCEL is a single-level cell programmed with one bit, the initialized read voltage may be determined as a voltage corresponding to a valley between the distribution of erased memory cells and the distribution of programmed memory cells. When the memory cell MCEL is a multi-level cell programmed with 2 bits or more, the initialized read voltage may be determined as a voltage corresponding to a valley between the distribution of erased memory cells and the distribution of least significant programmed memory cells or a voltage corresponding to a valley between program states.

The read voltage controller 11 may sequentially generate the first and second reference voltages V1 and V2 instead of the initialized read voltage and apply the generated first and second reference voltages V1 and V2 to the memory device 20 during a period in which a data read operation of determining the deterioration condition of the memory device 20 is performed.

Figure 2:
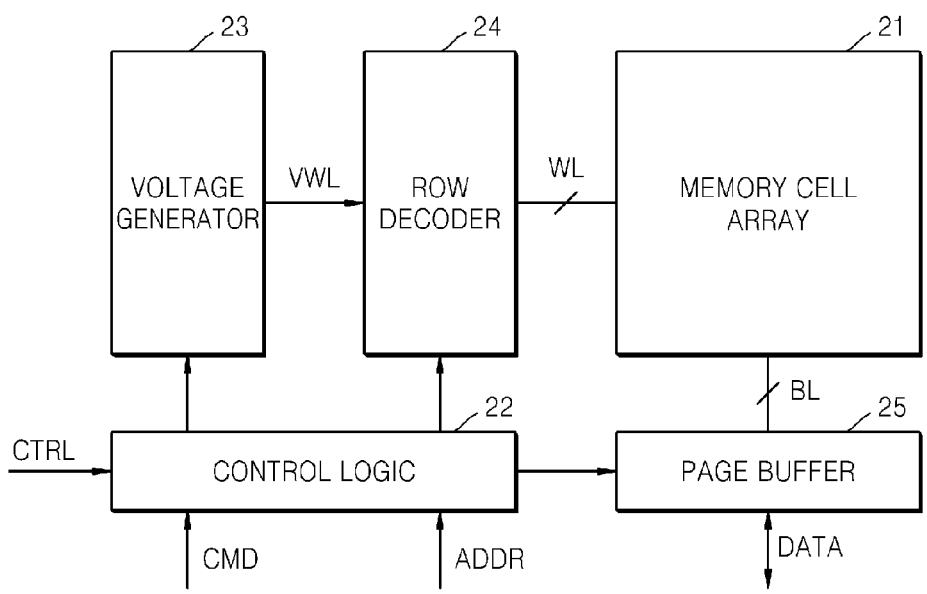
FIG. 2 is a detailed block diagram of a memory device included in the memory system of FIG. 1.

FIG. 2 is a detailed block diagram of the memory device included in the memory system of FIG. 1, according to an exemplary embodiment.

Referring to FIG. 2, the memory device 20 includes a memory cell array 21, control logic 22, a voltage generator 23, a row decoder 24, and a page buffer 25.

The control logic 22 writes data in the memory cell array 21 and/or outputs various control signals for reading data from the memory cell array 21 based on the command CMD, the address ADDR, and the control signal CTRL received from the memory controller 10. In this case, the control signal CTRL output by the control logic 22 is transmitted to the voltage generator 23, the row decoder 24, and the page buffer 25.

The voltage generator 23 generates a driving voltage VWL for driving a plurality of word lines WL in response to the control signal CTRL received from the control logic 22. Specifically, the driving voltage VWL may be a write voltage (or program voltage), a read voltage, an erase voltage, or a pass voltage.

The row decoder 24 enables some of the word lines WL based on a row address. Specifically, during a read operation, the row decoder 24 may apply a read voltage to a selected word line and apply a pass voltage to an unselected word line. For example, the first reference voltage V1 and the second reference voltage V2 generated by the read voltage controller 11 of the memory controller 10 may be sequentially applied to a selected word line corresponding to a storage region in which an operation of determining the deterioration condition of the memory device 20 will be performed. In other words, each of a read operation using the first reference voltage V1 and a read operation using the second reference voltage V2 may be performed in the selected word line corresponding to the storage region in which the operation of determining the deterioration condition of the memory device 20 will be performed. Meanwhile, during a write operation, the row decoder 24 may apply a write voltage to a selected word line and a pass voltage to an unselected word line.

The page buffer 25 is connected to the memory cell array 21 through a plurality of bit lines BL. The page buffer 25 temporarily stores data to be written in the memory cell array 21 or data read from the memory cell array 21. In exemplary embodiments, the page buffer 25 may store data read from memory cells connected to the selected word line according to the read operation using the first reference voltage V1. Also, the page buffer 25 may store data read from the memory cells connected to the selected word line according to the read operation using the second reference voltage V2.

Figure 3:
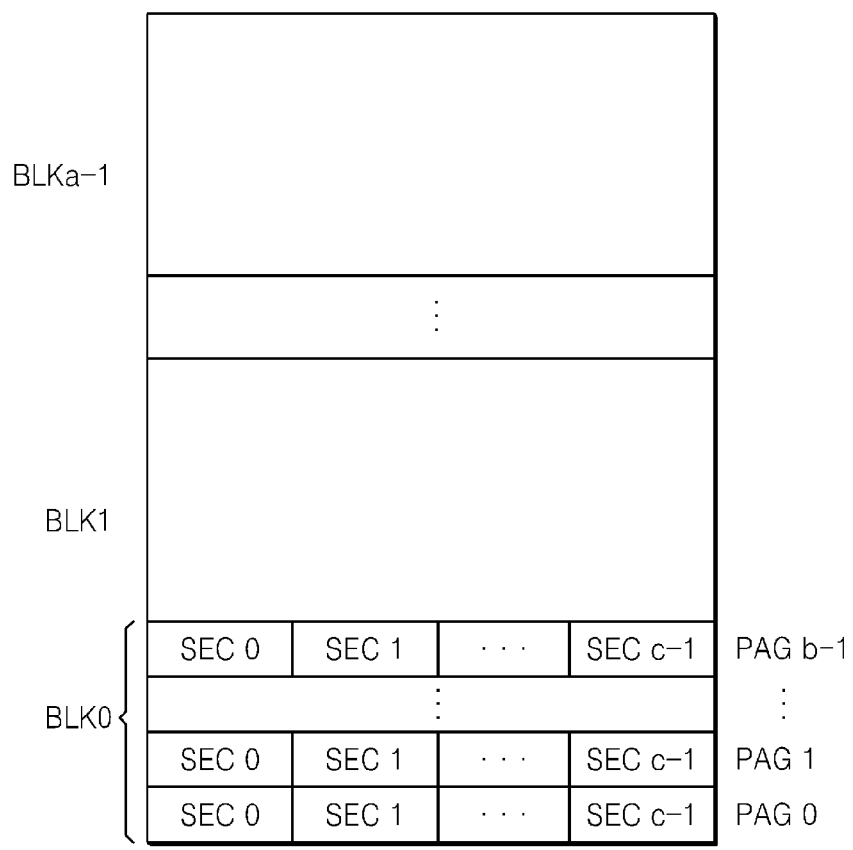
FIG. 3 illustrates an example of a cell array included in the memory device of FIG. 2.

FIG. 3 illustrates an example of the memory cell array 21 included in the memory device 20 of FIG. 2, according to an exemplary embodiment.

Referring to FIG. 3, the memory cell array 21 is a flash memory cell array. In this case, the memory cell array 21 includes a blocks BLK0 to BLKa-1 (here, a is an integer equal to or greater than 2). Each of the blocks BLK0 to BLKa-1 includes b pages PAG0 to PAGb-1 (here, b is an integer equal to or greater than 2), and each of the pages PAG0 to PAGb-1 includes c sectors SEC0 to SECc-1 (c is an integer equal to or greater than 2). For brevity, FIG. 3 illustrates only block BLK0 including the pages PAG0 to PAGb-1 and the sectors SEC0 to SECc-1. However, each of other blocks BLK1 to BLKa-1 have substantially the same configuration as the block BLK0.

Figure 4:
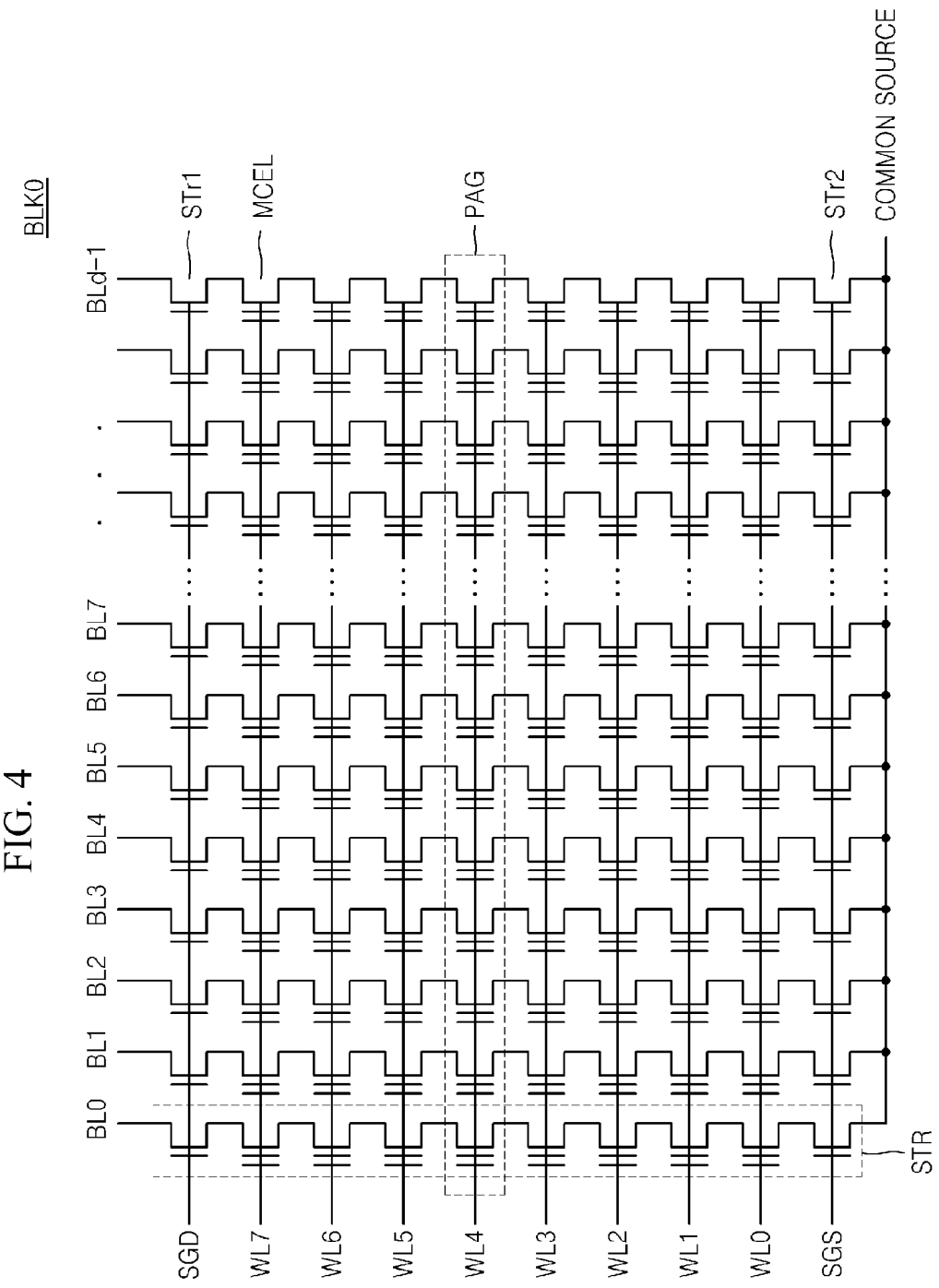
FIG. 4 is a circuit diagram of an example of a memory block included in the cell array of FIG. 3.

FIG. 4 is a circuit diagram of an example of the memory block BLK0 included in the memory cell array of FIG. 3, according to an exemplary embodiment.

Referring to FIG. 4, the memory cell array 21 may be a memory cell array of a NAND flash memory device. In this case, each of the blocks BLK0 to BLKa-1 shown in FIG. 3 may be embodied as shown in FIG. 4. Referring to FIG. 4, each of the blocks BLK0 to BLKa-1 include d strings STR (here, d is an integer equal to or greater than 2), and each of the strings STR includes 8 memory cells MCEL, for example, connected in series in the direction of bit lines BL0 to BLd-1. Each of the strings STR further include a drain select transistor Str1 and a source select transistor Str2 connected to both ends of the memory cells MCEL connected in series.

The NAND flash memory device having the structure shown in FIG. 4 may perform an erase operation in units of blocks and perform a program operation in units of pages PAG corresponding to the respective word lines WL0 to WL7. FIG. 4 illustrates an example in which one block includes 8 pages PAG corresponding to 8 word lines WL0 to WL7. However, the blocks BLK0 to BLKa-1 of the memory cell array 21 may include memory cells and pages in numbers different from the numbers of the memory cells MCEL and pages PAG shown in FIG. 4. Also, the memory device 20 shown in FIGS. 1 and 2 may include multiple memory cell arrays that have the same structure and perform the same operations as the above-described memory cell array 21.

Figure 5:
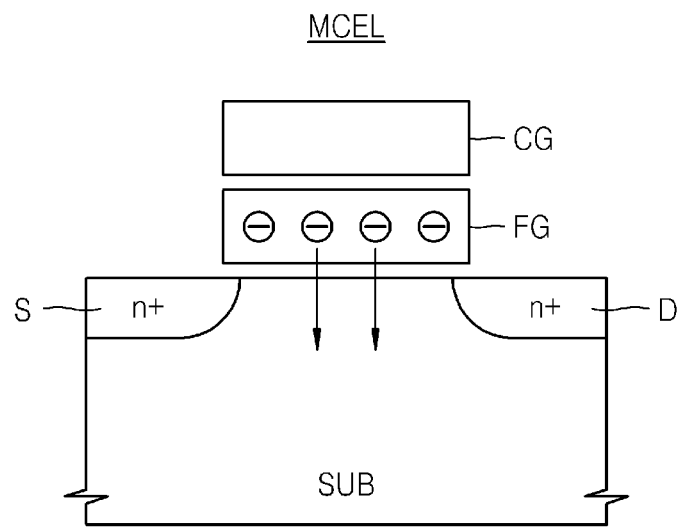
FIG. 5 is a cross-sectional view of an example of a memory cell included in the memory block of FIG. 4.

FIG. 5 is a cross-sectional view of an example of the memory cell MCEL included in the memory block BLK0 of FIG. 4, according to an exemplary embodiment.

Referring to FIG. 5, a source S and a drain D are formed in a substrate SUB, and a channel region is formed between the source S and the drain D. A floating gate FG is formed over the channel region, and an insulating layer, such as a tunneling insulating layer, is formed between the channel region and the floating gate FG. A control gate CG is formed over the floating gate FG, and an insulating layer, such as a blocking insulating layer, is disposed between the floating gate FG and the control gate CG. Voltages required to perform program, erase, and read operations on the memory cells MCEL are applied to the substrate SUB, the source S, the drain D, and the control gate CG.

In the flash memory device, data stored in the memory cell MCEL may be read due to discrimination between threshold voltages Vth of the memory cells MCEL. In this case, the threshold voltage Vth of each of the memory cells MCEL may be determined by the number of electrons stored in the floating gate FG. Specifically, as the number of the electrons stored in the floating gate FG increases, the threshold voltage Vth of the memory cell MCEL becomes higher.

The electrons stored in the floating gate FG of the memory cell MCEL may leak in the direction of the arrows due to various causes. Thus, the threshold voltage Vth of the memory cell MCEL may change. For example, the electrons stored in the floating gate FG may leak due to abrasion of the memory cell MCEL. Specifically, when access operations, such as program, read, or erase operations, are repeatedly performed on the memory cell MCEL, the insulating layer between the channel region and the floating gate FG may be worn away. As a result, the electrons stored in the floating gate FG may leak. In another example, the electrons stored in the floating gate FG may leak due to high-temperature stress or a difference in temperature between program and read operations.

Figure 6A:
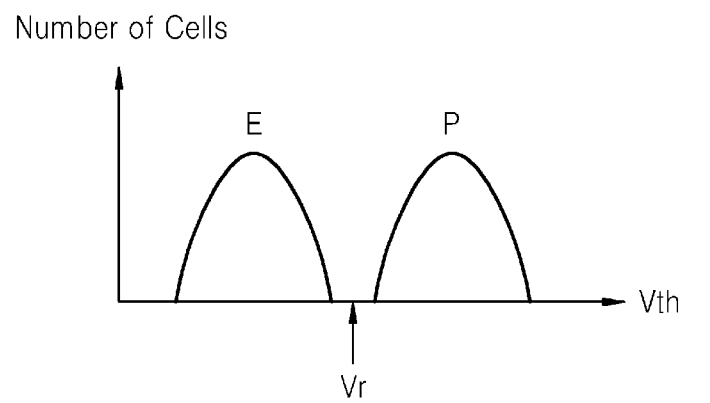
FIG. 6A is a graph of a target distribution relative to a threshold voltage of the memory device when the memory cell of FIG. 5 is a single-level cell.

FIG. 6A is a graph of a target distribution relative to a threshold voltage of the memory device when the memory cell MCEL of FIG. 5 is a single-level cell, according to an exemplary embodiment.

Referring to FIG. 6A, the abscissa denotes a threshold voltage Vth, and the ordinate denotes the number of memory cells. When the memory cell MCEL is a single-level cell programmed with one bit, the memory cell MCEL may be in one of an erase state E or a program state P. In this case, a read voltage Vr has a voltage level between the distribution of the memory cell MCEL in the erase state E and the distribution of the memory cell MCEL in the program state P.

For instance, when the read voltage Vr is applied to the control gate CG of the memory cell MCEL, if the memory cell MCEL is put into the erase state E, then it is turned on, while if the memory cell MCEL is put into the program state P then it is turned off. When the memory cell MCEL is turned on, current flows through the memory cell MCEL, while when the memory cell MCEL is turned off, current does not flow through the memory cell MCEL. Accordingly, data stored in the memory cell MCEL may be distinguished depending on whether the memory cell MCEL is turned on or off.

In an embodiment, when the memory cell MCEL is turned on with application of the read voltage Vr, storage of data "1" may be distinguished, while when the memory cell MCEL is turned off, storage of data "0" may be distinguished. However, the inventive concept is not limited thereto. In another embodiment, when the memory cell MCEL is turned on with application of the read voltage Vr, storage of data "0" may be distinguished, while when the memory cell MCEL is turned off, storage of data "1" may be distinguished. Thus, allocation of logic levels of data may vary according to embodiments.

Figure 6B:
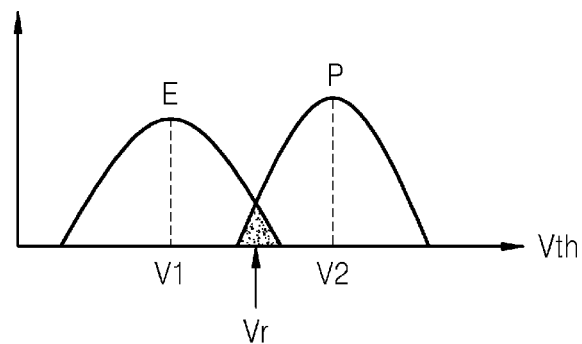
FIG. 6B is a graph of an actual initial distribution relative to a threshold voltage of the memory device when the memory cell of FIG. 5 is a single-level cell.

FIG. 6B is a graph of an actual initial distribution relative to a threshold voltage of the memory device when the memory cell MCEL of FIG. 5 is a single-level cell, according to an exemplary embodiment.

Referring to FIG. 6B, each memory cell MCEL programmed into an erase state E or a program state P may have a varied initial distribution as shown in FIG. 6B due to external stimuli. In FIG. 6B, read errors may occur in memory cells MCEL belonging to the overlapping portion illustrated with dots. As a result, the reliability of the memory device 20 may be degraded.

For example, when a read operation is performed on the memory device 20 using a read voltage Vr, even when the memory cells MCEL belonging to the portion illustrated with dots are programmed into the program state P, the corresponding memory cells MCEL may be determined as being in the erase state E due to a reduction in threshold voltage Vth. Thus, errors may occur in read operations, thereby degrading the reliability of the memory device 20.

FIG. 6B shows an example in which the first reference voltage V1 is determined as a middle value of the distribution of threshold voltages obtained in the erase state E, while the second reference voltage V2 is determined as a median value of the distribution of threshold voltages obtained in the program state P. Therefore, referring to FIG. 6B, the number X1 of memory cells having threshold voltages less than the first reference voltage V1 is about ½ the number of all memory cells put into the erase state E. Also, the number X2 of memory cells having threshold voltages higher than the second reference voltage V2 is about ½ the number of all memory cells put into the program state P. Thus, in the case of an initial distribution, the number X1 may be equal or similar to the number of X2.

Figure 6C:
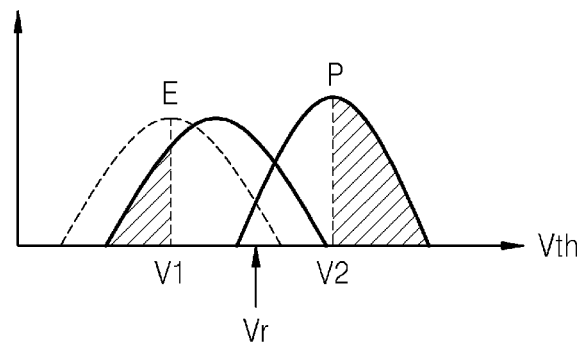
FIG. 6C is a graph showing a case in which distribution of a threshold voltage obtained in an erase state moves due to read disturbance as compared with the graph of FIG. 6B.

FIG. 6C is a graph showing a case in which the distribution of threshold voltages obtained in an erase state moves due to read disturbance as compared with the graph of FIG. 6B, according to an exemplary embodiment.

When read disturbance occurs, the distribution of threshold voltages obtained in the erase state E may move toward a higher voltage. That is, threshold voltages of memory cells put into the erase state E may increase. By comparison, read disturbance may not significantly affect the distribution of threshold voltages obtained in a program state P.

Referring to FIG. 6C, the distribution of the threshold voltages obtained in the erase state E moves toward a higher voltage (indicated by the transition from the dotted curve to the solid curve), and the distribution of the threshold voltages obtained in the program state P does not vary. Thus, as compared with an initial distribution, the number X1 of the memory cells having threshold voltages less than the first reference voltage V1 is reduced, while the number X2 of the memory cells having threshold voltages higher than the second reference voltage V2 hardly varies.

Figure 6D:
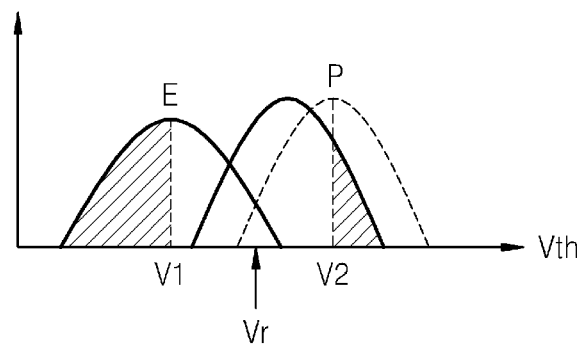
FIG. 6D is a graph showing a case in which distribution of a threshold voltage obtained in a program state moves due to charge loss as compared with the graph of FIG. 6B.

FIG. 6D is a graph showing a case in which the distribution of threshold voltages obtained in a program state P moves due to charge loss as compared with the graph of FIG. 6B, according to an exemplary embodiment.

When charge loss occurs, the distribution of the threshold voltages obtained in the program state P may move toward a lower voltage. That is, threshold voltages of the memory cells MCEL put into the program state P may be reduced. By comparison, the charge loss may not significantly affect the distribution of threshold voltages obtained in an erase state E.

Referring to FIG. 6D, the distribution of the threshold voltages obtained in the program state P moves toward a lower voltage (indicated by the transition from the dotted curve to a solid curve), and the distribution of the threshold voltages obtained in the erase state E does not vary. Thus, as compared with an initial distribution, the number X1 of the memory cells having threshold voltages less than the first reference voltage V1 hardly varies, while the number X2 of memory cells having threshold voltages higher than the second reference voltage V2 is reduced.

Figure 7A:
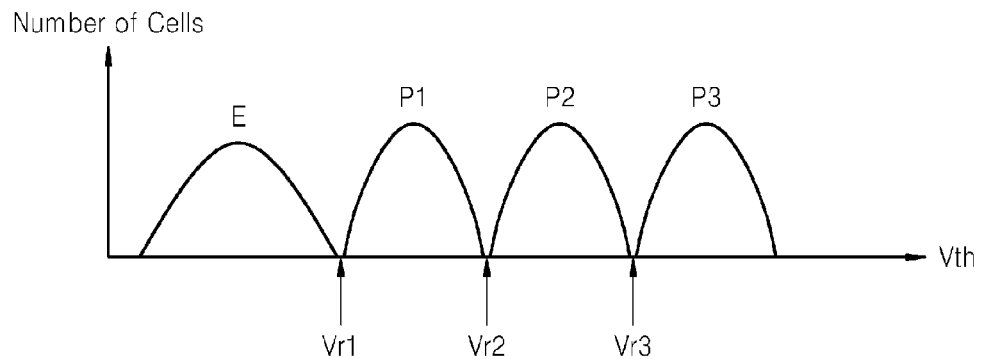
FIG. 7A is a graph of a target distribution relative to a threshold voltage of the memory device when the memory cell of FIG. 5 is a 2-bit multi-level cell.

FIG. 7A is a graph of a target distribution relative to a threshold voltage of the memory device when the memory cell MCEL of FIG. 5A is a 2-bit multi-level cell, according to an exemplary embodiment.

Referring to FIG. 7A, the abscissa denotes a threshold voltage Vth, and the ordinate denotes the number of memory cells. When the memory cell MCEL is a 2-bit multi-level cell programmed with 2 bits, the memory cell MCEL may be in one of an erase state E, a first program state P1, a second program state P2, and a third program state P3. As compared with the case in which the memory cell MCEL is a single-level cell, when the memory cell MCEL is the multi-level cell, since intervals between distributions of threshold voltages Vth are narrow, critical problems may be caused by minute variations in threshold voltages Vth.

A first read voltage Vr1 has a voltage level between the distribution of memory cells MCEL in the erase state E and the distribution of memory cells MCEL in the first program state P1. A second read voltage Vr2 has a voltage level between the distribution of memory cells MCEL in the first program state P1 and the distribution of memory cells MCEL in the second program state P2. A third read voltage Vr3 has a voltage level between the distribution of memory cells MCEL in the second program state P2 and the distribution of memory cells MCEL in the third program state P3.

Figure 7B:
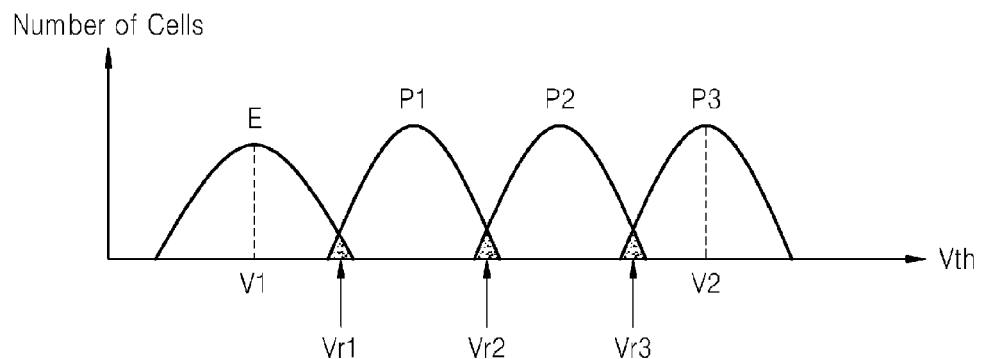
FIG. 7B is a graph of an actual initial distribution relative to a threshold voltage of the memory device when the memory cell of FIG. 5 is a 2-bit multi-level cell.

FIG. 7B is a graph of an actual initial distribution relative to a threshold voltage of the memory device when the memory cell MCEL of FIG. 5 is a 2-bit multi-level cell, according to an exemplary embodiment.

Referring to FIG. 7B, memory cells MCEL respectively programmed in an erase state E and first through third program states P1, P2, and P3 may have a changed distribution as shown in FIG. 7B due to external stimuli. In FIG. 7B, read errors may occur in the memory cells MCEL belonging to overlapping portions illustrated with dots, thereby degrading reliability of the memory device 20.

FIG. 7B shows an example in which a first reference voltage V1 s determined as a middle value of the distribution of threshold voltages obtained in the erase state E, while a second reference voltage V2 is determined as a middle value of the distribution of threshold voltages obtained in the third program state P3. Therefore, referring to FIG. 7B, the number X1 of memory cells having threshold voltages less than the first reference voltage V1 is about ½ the number of all memory cells put into the erase state E. Also, the number X2 of memory cells having threshold voltages higher than the second reference voltage V2 is about ½ the number of all memory cells put into the third program state P3. Thus, in the case of the initial distribution, the number X1 may be equal or similar to the number X2.

Figure 7C:
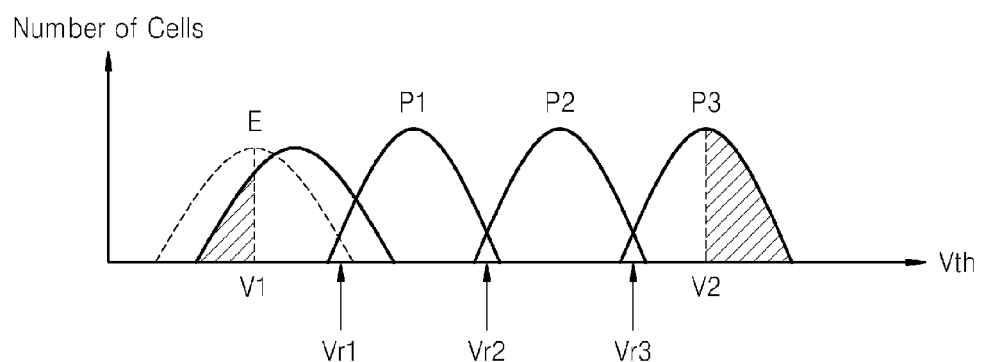
FIG. 7C is a graph showing a case in which the distribution of threshold voltages obtained in an erase state moves due to read disturbance as compared with the graph of FIG. 7B.

FIG. 7C is a graph showing a case in which the distribution of threshold voltages obtained in an erase state moves due to read disturbance as compared with the graph of FIG. 7B, according to an exemplary embodiment.

When read disturbance occurs, the distribution of the threshold voltages obtained in the erase state E may move toward a higher voltage. That is, threshold voltages of the memory cells MCEL put into the erase state E may increase. By comparison, the read disturbance may not significantly affect the distributions of threshold voltages obtained in the first through third program states P1, P2, and P3.

Referring to FIG. 7C, the distribution of the threshold voltages obtained in the erase state E moves toward a higher voltage (indicated by the transition from the dotted curve to the solid curve), and the distribution of the threshold voltages obtained in the third program state P3 does not vary. Thus, as compared with an initial distribution, the number X1 of the memory cells having threshold voltages less than the first reference voltage V1 is reduced, while the number X2 of the memory cells having threshold voltages higher than the second reference voltage V2 hardly varies.

Figure 7D:
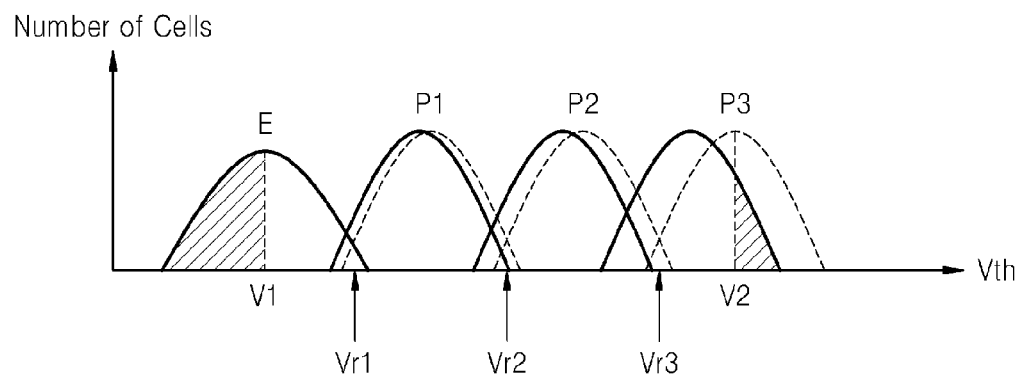
FIG. 7D is a graph showing a case in which the distribution of threshold voltages obtained in a program state move due to charge loss as compared with the graph of FIG. 7B.

FIG. 7D is a graph showing a case in which the distributions of threshold voltages obtained in the first through third program states P1, P2, and P3 move due to charge loss as compared with the graph of FIG. 7B, according to an exemplary embodiment.

When charge loss occurs, the distributions of the threshold voltages obtained in the first through third program states P1, P2, and P3 may move toward lower voltages. That is, threshold voltages of memory cells put into the first through third program states P1, P2, and P3 may be reduced. By comparison, the charge loss may not significantly affect the distribution of threshold voltages obtained in the erase state E. For reference, when the charge loss occurs, the distribution of the threshold voltages obtained in the third program state P3 may move by larger amounts than the distributions of the threshold voltages obtained in the first and second program states P1 and P2.

Referring to FIG. 7D, the distribution of the threshold voltages obtained in the third program state P3 moves toward a lower voltage (indicated by the transition from the dotted curve to the solid curve), and the distribution of the threshold voltages obtained in the erase state E does not vary. Thus, as compared with an initial distribution, the number X1 of the memory cells having threshold voltages less than the first reference voltage V1 hardly varies, while the number X2 of the memory cells having threshold voltages higher than the second reference voltage V2 is reduced.

Figure 8A:
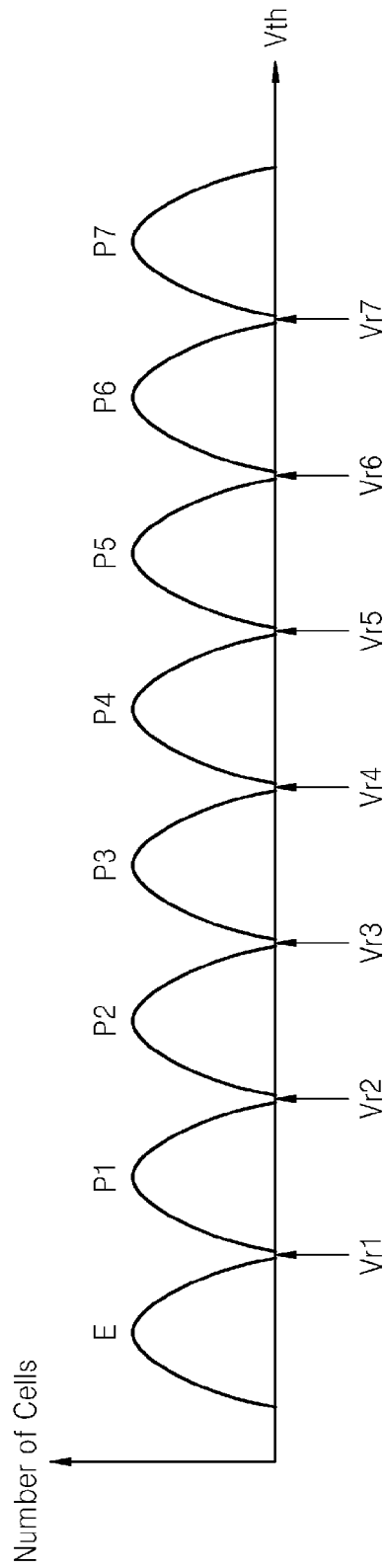
FIG. 8A is a graph of a target distribution relative to a threshold voltage of the memory device when the memory cell of FIG. 5 is a 3-bit multi-level cell.

FIG. 8A is a graph of a target distribution relative to a threshold voltage of the memory device 20 when the memory cell MCEL of FIG. 5 is a 3-bit multi-level cell, according to an exemplary embodiment.

Referring to FIG. 8A, the abscissa denotes a threshold voltage Vth, and the ordinate denotes the number of memory cells MCEL. When the memory cell MCEL is a 3-bit multi-level cell programmed with 3 bits, the memory cell MCEL may be in one of an erase state E, a first program state P1, a second program state P2, a third program state P3, a fourth program state P4, a fifth program state P5, a sixth program state P6, or a seventh program state P7. As compared with a case in which the memory cell MCEL is a single-level cell, when the memory cell MCEL is a multi-level cell, since intervals between the distributions of threshold voltages Vth are narrow, a critical problem may be caused by minute variations in threshold voltages Vth.

A first read voltage Vr1 has a voltage level between the distribution of memory cells MCEL in the erase state E and the distribution of memory cells MCEL in the first program state P1. A second read voltage Vr2 has a voltage level between the distribution of the memory cells MCEL in the first program state P1 and the distribution of memory cells MCEL in the second program state P2. A third read voltage Vr3 has a voltage level between the distribution of the memory cells MCEL in the second program state P2 and the distribution of memory cells MCEL in the third program state P3. A fourth read voltage Vr4 has a voltage level between the distribution of the memory cells MCEL in the third program state P3 and the distribution of memory cells MCEL in the fourth program state P4. A fifth read voltage Vr5 has a voltage level between the distribution of the memory cells MCEL in the fourth program state P4 and the distribution of the memory cells MCEL in the fifth program state P5. A sixth read voltage Vr6 has a voltage level between the distribution of the memory cells MCEL in the fifth program state P5 and the distribution of memory cells MCEL in the sixth program state P6. A seventh read voltage Vr7 has a voltage level between the distribution of the memory cells MCEL in the sixth program state P6 and the distribution of memory cells MCEL in the seventh program state P7.

Figure 8B:
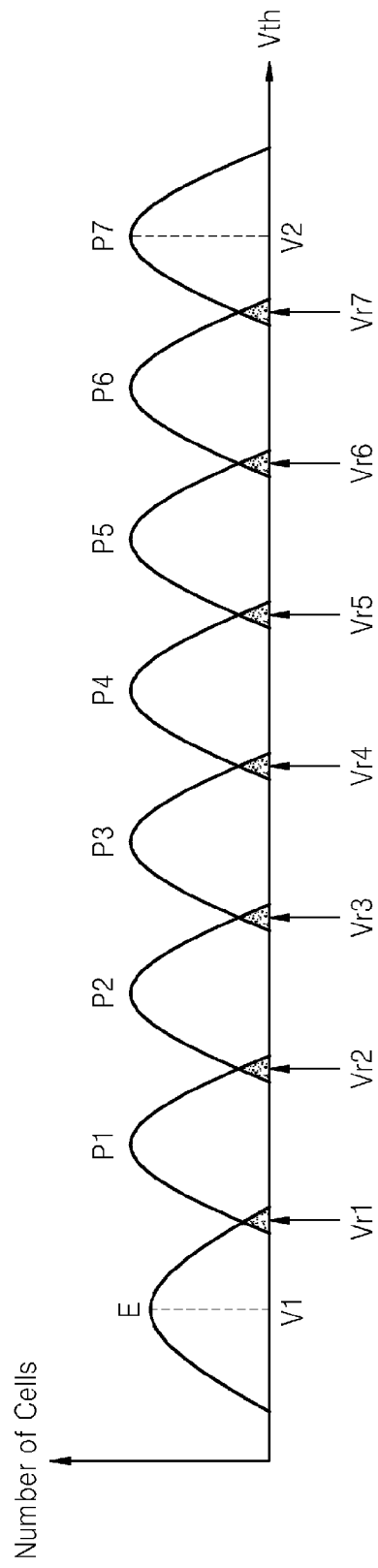
FIG. 8B is a graph of an actual initial distribution relative to a threshold voltage of the memory device when the memory cell of FIG. 5 is a 3-bit multi-level cell.

FIG. 8B is a graph of an actual initial distribution relative to a threshold voltage of the memory device when the memory cell MCEL of FIG. 5 is a 3-bit multi-level cell, according to an exemplary embodiment.

Referring to FIG. 8B, memory cells MCEL respectively programmed in an erase state E and first through seventh program states P1 to P7 may have a changed distribution as shown in FIG. 8B due to external stimuli. In FIG. 8B, read errors may occur in memory cells MCEL belonging to overlapping portions illustrated with dots, thereby degrading reliability of the memory device 20.

FIG. 8B shows an example in which a first reference voltage V1 is determined as a median value of the distribution of threshold voltages obtained in the erase state E, while a second reference voltage V2 is determined as a median value of the distribution of threshold voltages obtained in the seventh program state P7. Referring to FIG. 8B, the number X1 of memory cells MCEL having threshold voltages less than the first reference voltage V1 is about ½ the number of all memory cells put into the erase state E. Also, the number X2 of memory cells having threshold voltages higher than the second reference voltage V2 is about ½ the number of all memory cells put into the seventh program state P7. Thus, in the case of an initial distribution, the number X1 may be equal or similar to the number X2.

Figure 8C:
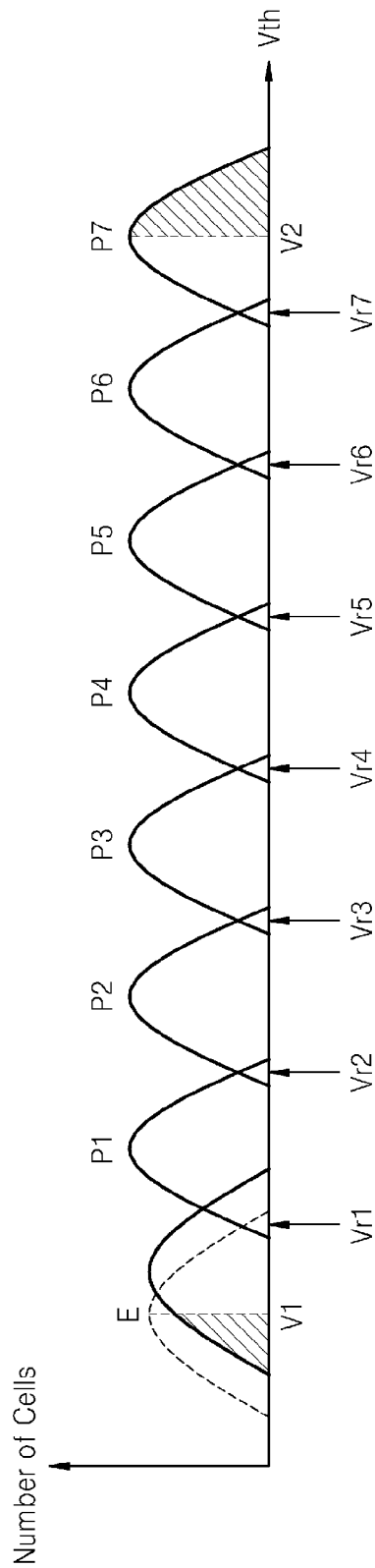
FIG. 8C is a graph showing a case in which the distribution of threshold voltages obtained in an erase state moves due to read disturbance as compared with the graph of FIG. 8B.

FIG. 8C is a graph showing a case in which the distribution of threshold voltages obtained in an erase state moves due to read disturbance as compared with the graph of FIG. 8B, according to an exemplary embodiment.

When read disturbance occurs, the distribution of threshold voltages obtained in an erase state E may move toward a high voltage. That is, threshold voltages of memory cells MCEL put into the erase state E may increase. By comparison, the read disturbance may not significantly affect the distribution of threshold voltages obtained in the first through seventh program states P1 to P7.

Referring to FIG. 8C, the distribution of threshold voltages obtained in the erase state E moves toward a higher voltage (indicated by the transition from the dotted curve to the solid curve), and the distribution of threshold voltages obtained in the first through seventh program states P1 to P7 does not vary. Thus, as compared with the initial distribution, the number X1 of memory cells having threshold voltages less than the first reference voltage V1 is reduced, while the number X2 of memory cells having threshold voltages higher than the second reference voltage V2 hardly varies.

Figure 8D:
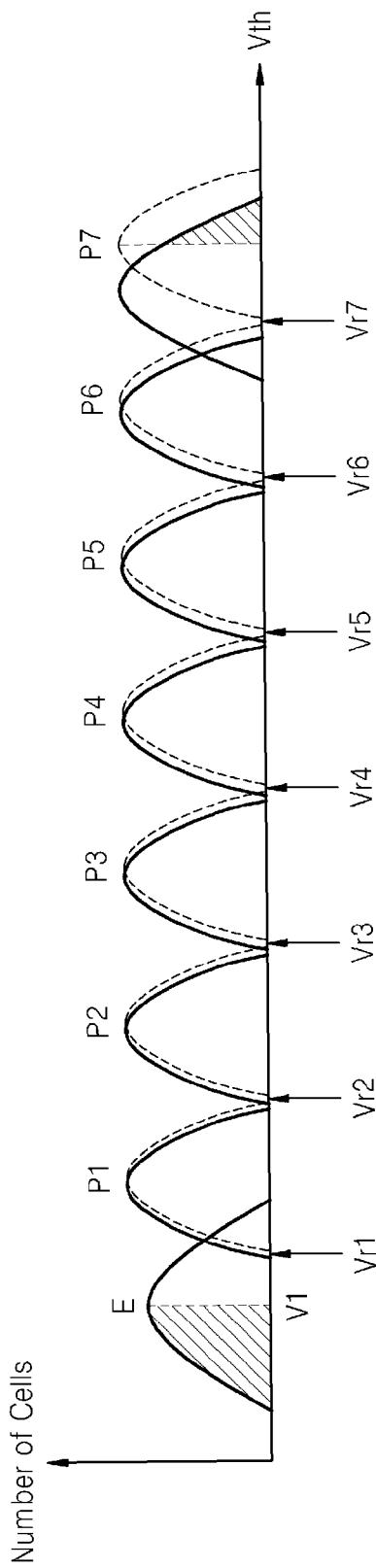
FIG. 8D is a graph showing a case in which the distribution of threshold voltages obtained in a program state moves due to charge loss as compared with the graph of FIG. 8B.

FIG. 8D is a graph showing a case in which the distributions of threshold voltages obtained in the first through seventh states P1 to P7 move due to charge loss as compared with the graph of FIG. 8B, according to an exemplary embodiment.

When charge loss occurs, the distribution of the threshold voltages obtained in the first through seventh program states P1 to P7 may move to a lower voltage. That is, threshold voltages of memory cells MCEL put into the first through seventh program states P1 to P7 may be reduced. By comparison, the charge loss may not significantly affect the distribution of threshold voltages obtained in the erase state E. For reference, when the charge loss occurs, the distribution of threshold voltages obtained in the seventh program state P7 may move by larger amounts than the distributions of threshold voltages obtained in the first through sixth program states P1 to P6.

Referring to FIG. 8D, the distribution of the threshold voltages obtained in the seventh program state P7 moves toward a low voltage (as indicated by the transition from the dotted curve to the solid curve), and the distribution of the threshold voltages obtained in the erase state E does not vary. Thus, as compared with the initial distribution, the number X1 of memory cells having threshold voltages less than the first reference voltage V1 hardly varies, while the number X2 of memory cells having threshold voltages higher than the second reference voltage V2 is reduced.

As described above, the distribution of threshold voltages of memory cells of the memory device 20 may be changed due to read disturbance or charge loss. When the distribution of the threshold voltages of the memory cells is changed, errors may occur during a data read operation. Also, when a variation in the distribution of the threshold voltages increases, an error correction failure state may occur.

Thus, the above-described exemplary embodiments have provided a method and apparatus for determining a type of deterioration condition of a storage region of the memory device 20 in which an error correction failure state occurs. Also, the exemplary embodiments have provided a method of performing a reliability recovery process corresponding to the determined type of deterioration condition in the memory system 100.

The above-described embodiments pertain to cases in which the memory cell MCEL is a single-level cell, a 2-bit multi-level cell, or a 3-bit multi-level cell. However, the inventive concept is not limited thereto, and the memory cell MCEL of FIG. 5 may be a multi-level cell programmed with 4 bits or more. Also, the memory device 20 of FIGS. 1 and 2 may include memory cells MCEL programmed with different numbers of bits.

Figure 9:
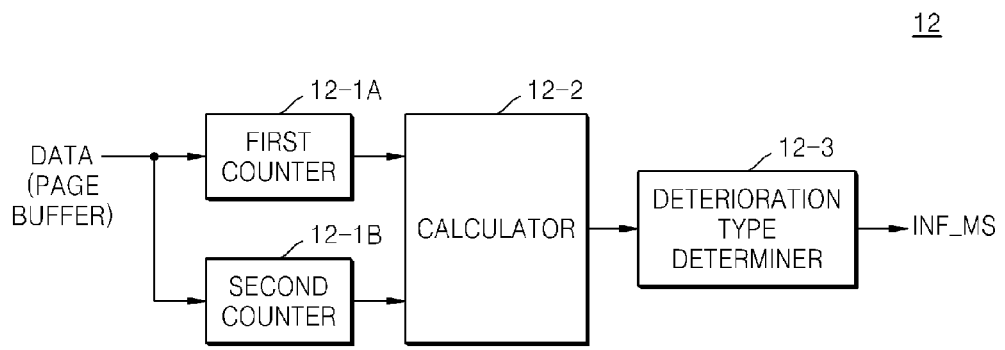
FIG. 9 is a detailed construction diagram of a memory state determiner of FIG. 1, according to an exemplary embodiment of the inventive concept.

An operation of the memory state determiner 12 shown in FIG. 1 will now be described in detail. FIG. 9 is a construction diagram of the memory state determiner 12 of FIG. 1, according to an exemplary embodiment of the inventive concept.

As shown in FIG. 9, the memory state determiner 12 includes a first counter 12-1A, a second counter 12-1B, a calculator 12-2, and a deterioration type determiner 12-3.

Referring to FIG. 1, in an example, when an error correction failure state occurs during a read operation, the memory controller 10 controls the memory system 100 to enter a memory state determination mode. In another example, when the memory system 100 is in an idle state, the memory controller 10 controls the memory system 100 to enter the memory state determination mode and perform a memory state determination operation on a storage region of the memory device 100 in which an error correction failure state has occurred.

In the memory state determination mode, the read voltage controller 11 sequentially applies a first reference voltage V1 and a second reference voltage V2, which are required to determine a deterioration condition of the memory device 20, as read voltages to the memory device 20. The memory controller 10 applies the first reference voltage V1 to a word line of the memory device 20 corresponding to the storage region for which the deterioration condition is to be determined, and applies an address ADDR, a command CMD, and a control signal CTRL to the memory device 20 to perform a first read operation. Thus, due to the first read operation, data read from memory cells connected to a selected word line corresponding to the storage region for which the deterioration condition is to be determined may be stored in the page buffer 25 of the memory device 20.

Thereafter, the first counter 12-1A of the memory state determiner 12 counts the number of bits having a first logic value from among data stored in the page buffer 25 of the memory device 20 and/or calculates the number of memory cells having threshold voltages less than or equal to the first reference voltage V1. A result counted by the first counter 12-1A corresponds to first information X1. For example, a bit value read from memory cells having threshold voltages less than or equal to the first reference voltage V1, from among the memory cells connected to the selected word line during the first read operation, may be determined as the first logic value.

In an example, when data of memory cells that are turned on during the read operation is determined as "1", the first logic value may be "1". Also, when data of memory cells that are turned on during the read operation is determined as "0", the first logic value may be "0".

Next, the memory controller 10 applies second reference voltage V2 to the word line of the memory device 20 corresponding to the storage region for which the deterioration condition is to be determined, and applies an address ADDR, a command CMD, and a control signal CTRL to the memory device 20 to perform a second read operation. Thus, due to the second read operation, data read from memory cells connected to a selected word line corresponding to the storage region for which the deterioration condition is to be determined may be stored in the page buffer 25 of the memory device 20.

Thereafter, the second counter 12-1B of the memory state determiner 12 counts the number of bits having a second logic value from among data stored in the page buffer 25 of the memory device 20 and/or calculates the number of memory cells having threshold voltages greater than the second reference voltage V2. A result counted by the second counter 12-1B corresponds to second information X2. For example, a bit value read from memory cells having threshold voltages higher than the second reference voltage V2, from among the memory cells connected to the selected word line during the second read operation, may be determined as the second logic value.

In an example, when data of memory cells that are turned off during the read operation is determined as "0", the second logic value may be "0". Also, when data of memory cells that are turned off during the read operation is determined as "1", the second logic value may be "1".

After the first and second read operations are performed, the calculator 12-2 applies a predetermined equation to discriminate among the types of deterioration conditions of the memory device 20 using the first information X1 counted by the first counter 12-1A and the second information X2 counted by the second counter 12-1B. In an example, the predetermined equation may discriminate among the types of deterioration condition based on a support vector machine algorithm in the distribution chart of the experimentally measured first and second information X1 and X2. The distribution of the first and second information X1 and X2 may be experimentally measured by the memory system 100 according to various circumstances is shown in FIG. 20, for example.

Figure 20:
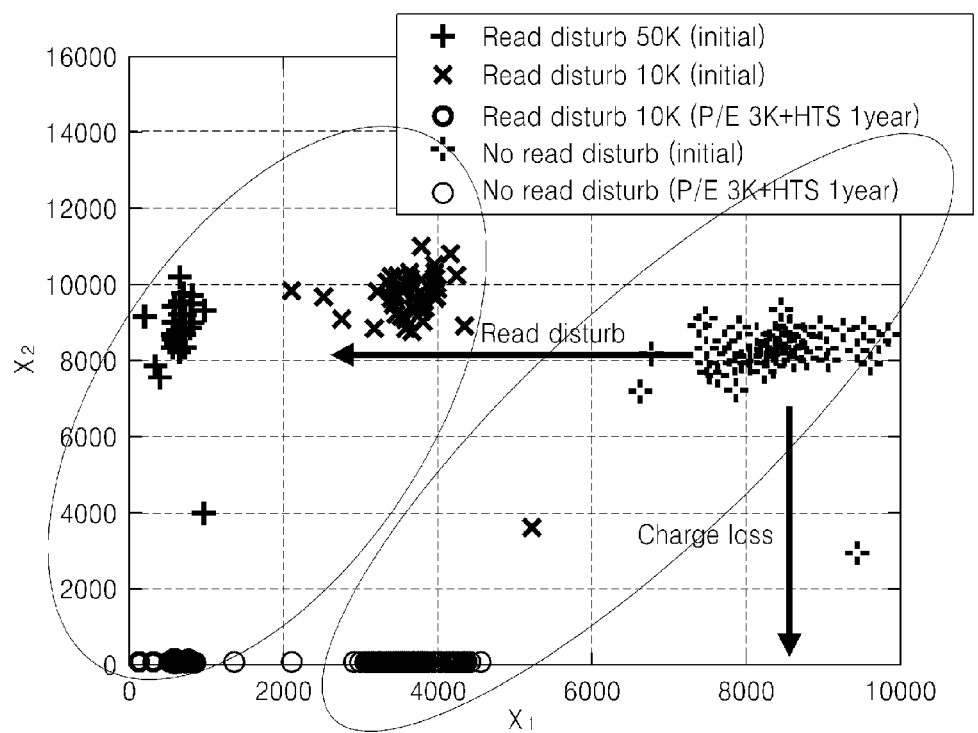
FIG. 20 is a graph showing the distribution of first and second information experimentally measured according to various circumstances in a memory system, according to an exemplary embodiment of the inventive concept.

Referring to FIG. 20, it can be seen that initial distributions free from read disturbance center around coordinates (8000, 8000), that initial distributions caused by occurrence of 10K-read disturbance center around coordinates (4000, 9500), and that initial coordinates caused by occurrence of 50K-read disturbance center around coordinates (700, 9000). Also, it can be seen that distributions obtained under conditions in which no read disturbance has occurred, the number of program-erase (P/E) cycles is 3K, and one year has elapsed in a high-temperature stress (HTS) state center around coordinates (4000, 0), and that distributions obtained under conditions in which 10K-read disturbance has occurred, the number of P/E cycles is 3K, and one year has elapsed in an HTS state center around coordinates (700, 0).

Therefore, it can be inferred that when read disturbance occurs, distributions move in a direction in which the value of the first information X1 is reduced, while when charge loss occurs, distributions move in a direction in which the value of the second information X2 is reduced.

Thus, an equation for discriminating between read disturbance and charge loss may be obtained using the characteristics of distributions of the first and second information X1 and X2 that are experimentally measured by provoking read disturbance and/or charge loss. In an example, an equation for discriminating between read disturbance and charge loss may be obtained from the distributions measured in FIG. 20 using a known support vector machine algorithm.

Figure 21:
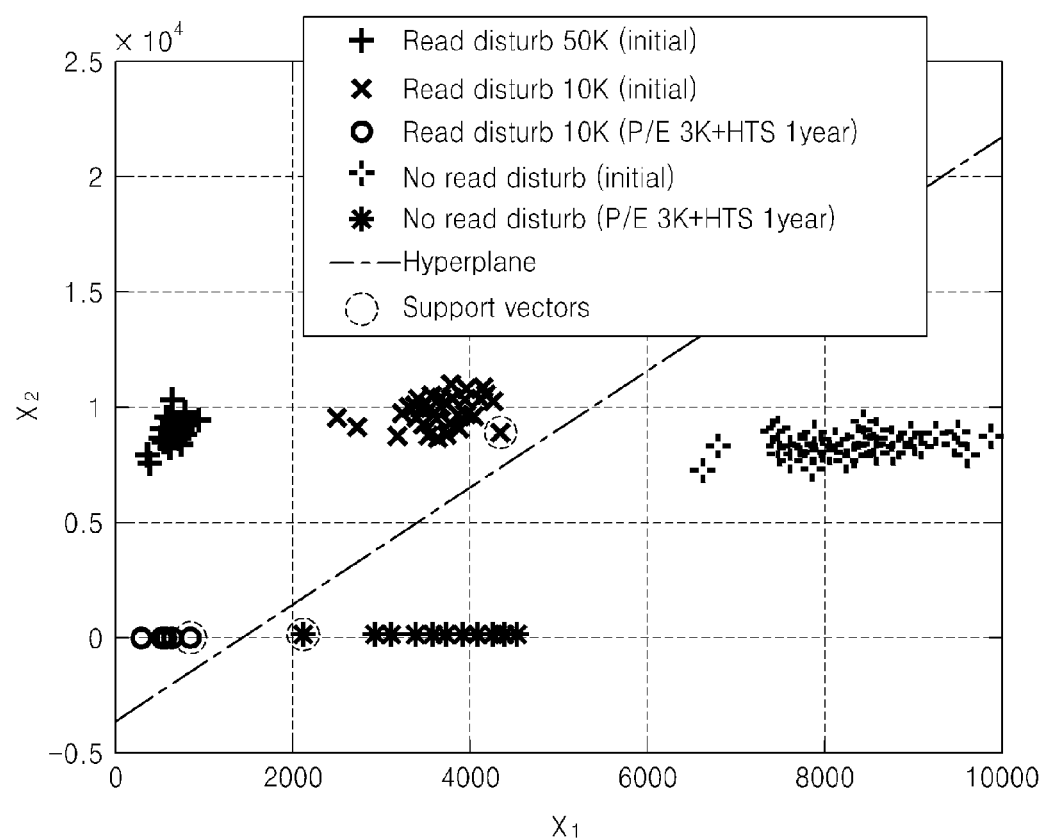
FIG. 21 is a graph showing a method of determining an equation for discriminating among types of deterioration condition from a distribution chart of first and second information experimentally measured according to various circumstances in a memory system, according to an exemplary embodiment of the inventive concept.

FIG. 21 is a graph showing a method of determining an equation for discriminating among the types of deterioration conditions in the distribution chart of the first and second information X1 and X2 shown in FIG. 20.

Referring to FIG. 21, a hyperplane linear equation for discriminating between a read disturbance state and a charge loss state may be obtained using a support vector machine algorithm. In FIG. 21, support vectors may be determined as values of the first and second information X1 and X2 closest to a hyperplane, from among distributions obtained under various conditions.

In an example, an equation for calculating S for discriminating among the types of deterioration conditions using the support vector machine algorithm may be expressed as shown in Numerical expression 1, where w1, w2, and b are constants:

$$S = w1X1 + w2X2 - b \qquad (1)$$

In Numerical expression 1, coefficients w1 and w2 and constant b may be calculated by obtaining the hyperplane linear equation of FIG. 21. The calculated coefficients w1 and w2 and constant b may be stored in the memory controller 10 or the memory device 20, for example.

By replacing a kernel function with another function using the support vector machine algorithm, an equation for discriminating among the types of deterioration condition may be obtained not only in a linear form but also in a curved or circular form.

Referring again to FIG. 9, in an example, the calculator 12-2 may enter the first information X1 counted by the first counter 12-1A and the second information X2 counted by the second counter 12-1B into Numerical expression 1, to which the coefficients w1 and w2 and the constant b obtained by experimental measurements are applied, and solve for S.

The deterioration type determiner 12-3 may then determine the type of deterioration condition of a selected word line or block of the memory device 20 based on the value of S calculated by the calculator 12-2. For example, the deterioration type determiner 12-3 may determine the type of deterioration condition according to the sign of S. Specifically, when the sign of S is a plus (+) sign, the deterioration type determiner 12-3 may determine that the selected word line or block is in a read-disturbance-type deterioration condition. When the sign of S is a minus (−) sign, the deterioration type determiner 12-3 may determine that the selected word line or block is in a charge-loss-type deterioration condition.

The deterioration type determiner 12-3 generates information INF_MS indicating the determined type of deterioration condition. The memory controller 10 may control the memory system 100 to perform a reliability recovery process corresponding to the information INF_MS generated by the deterioration type determiner 12-3.

For example, when the information INF_MS generated by the deterioration type determiner 12-3 indicates a read-disturbance-type deterioration condition, the memory controller 10 may control the memory system 100 to transfer data, stored in the block for which the memory state determination mode was performed, to another block. When the information INF_MS generated by deterioration type determiner 12-3 indicates a charge-loss-type deterioration condition, the memory controller 10 may control the memory system 100 to apply an initialized program stress voltage to a word line corresponding to a storage region for which the memory state determination mode was performed, and perform an additional program. The initialized program stress voltage may be experimentally determined, for example, such that threshold voltages increase by as much as a decrement in threshold voltages obtained in program states due to charge loss.

Figure 10:
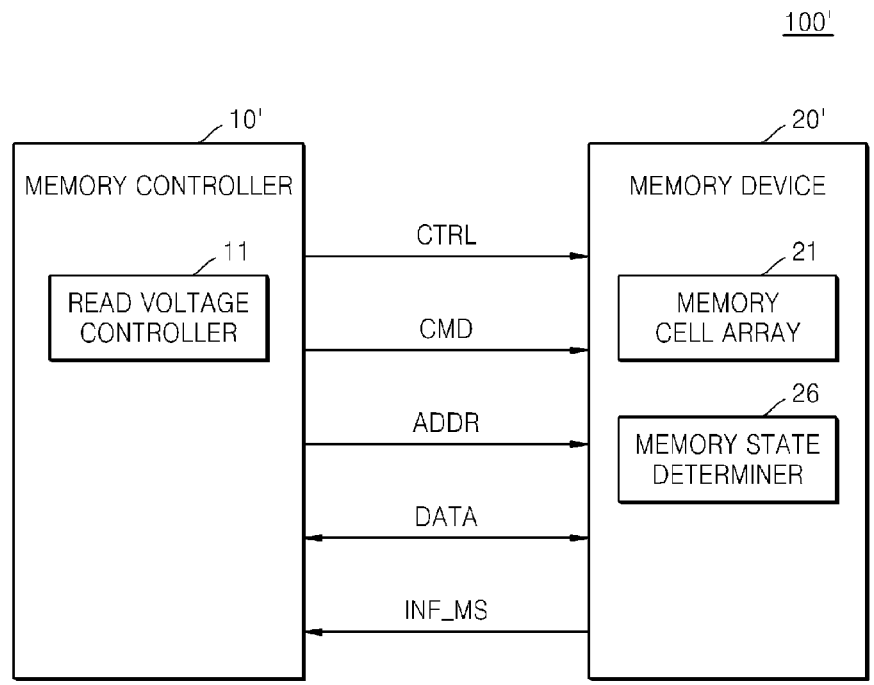
FIG. 10 is a schematic block diagram of a memory system, according to an exemplary embodiment of the inventive concept.

FIG. 10 is a schematic block diagram of a memory system, according to another exemplary embodiment of the inventive concept.

Referring to FIG. 10, memory system 100' includes a memory controller 10' and a memory device 20'. Some of components included in the memory system 100' according to the present embodiment may be substantially the same as those of the memory system 100 of FIG. 1. The same components are denoted by the same reference numerals as in FIG. 1, and descriptions thereof are not repeated. Hereinafter, differences between the memory system 100 of FIG. 1 and the memory system 100' according to the present embodiment will chiefly be described in detail.

The memory device 20' includes a memory cell array 21 and a memory state determiner 26. The memory cell array 21 includes a plurality of memory cells disposed at intersections between a plurality of word lines and a plurality of bit lines. The memory state determiner 26 determines a deterioration condition of the memory device 20' caused by movement of an erase state or a program state based on an initial distribution of threshold voltages of memory cells of the memory device 20'. The memory state determiner 26 may be substantially the same as the memory state determiner 12 included in the memory controller 10 shown in FIG. 1.

The memory controller 10' includes a read voltage controller 11. Since the read voltage controller 11 is already described above with reference to FIG. 1, the description will not be repeated.

Referring to FIG. 10, in the memory system 100', information INF_MS regarding the type of deterioration condition generated by the memory state determiner 26 included in the memory device 20' may be transmitted to the memory controller 10'. Thus, the memory controller 10' may control the memory system 100 to perform a reliability recovery process corresponding to the information INF_MS regarding the type of deterioration condition transmitted from the memory device 20'.

Figure 11:
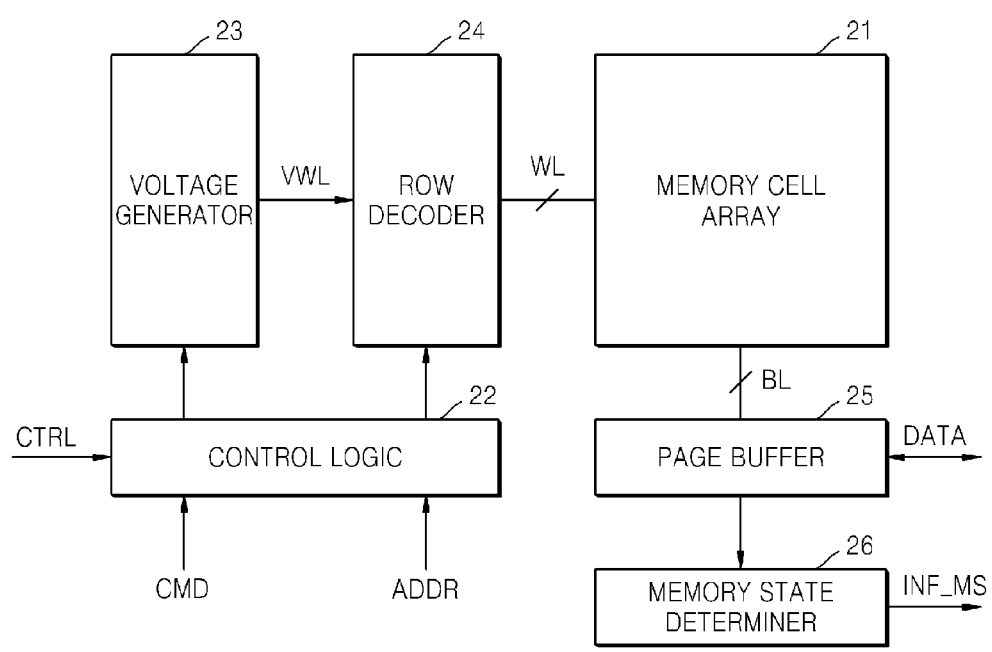
FIG. 11 is a detailed block diagram of a memory device included in the memory system of FIG. 10.

FIG. 11 is a detailed block diagram of the memory device included in the memory system of FIG. 10, according to an exemplary embodiment.

Referring to FIG. 11, the memory device 20' includes a memory cell array 21, control logic 22, a voltage generator 23, a row decoder 24, a page buffer 25, and a memory state determiner 26. Some of components included in the memory device 20' according to an exemplary embodiment of the inventive concept may be substantially the same as components included in the memory device 20 of FIG. 2. The same components are denoted by the same reference numerals as in the memory device 20 of FIG. 2, and descriptions thereof will not be repeated. Hereinafter, differences between the memory device 20 of FIG. 2 and the memory device 20' according to the present embodiment will chiefly be described.

In an example, in a memory state determination mode, the memory state determiner 26 counts the number of bits having a first logic value stored in the page buffer 25 of the memory device 20' after a first read operation is performed using a first reference voltage V1, and calculates first information X1. Also, in the memory state determination mode, the memory state determiner 26 counts the number of bits having a second logic value stored in the page buffer 25 of the memory device 20' after a second read operation is performed using a second reference voltage V2, and calculates second information X2. Thereafter, the memory state determiner 26 enters the first and second information X1 and X2 in a predetermined equation and determines the type of deterioration condition for a target storage region of the memory device 20 based on a calculation result.

The operation of determining the type of deterioration condition in the memory state determiner 26 is described above with reference to FIGS. 1 through 9. Therefore, the description thereof will not be repeated.

Figure 12:
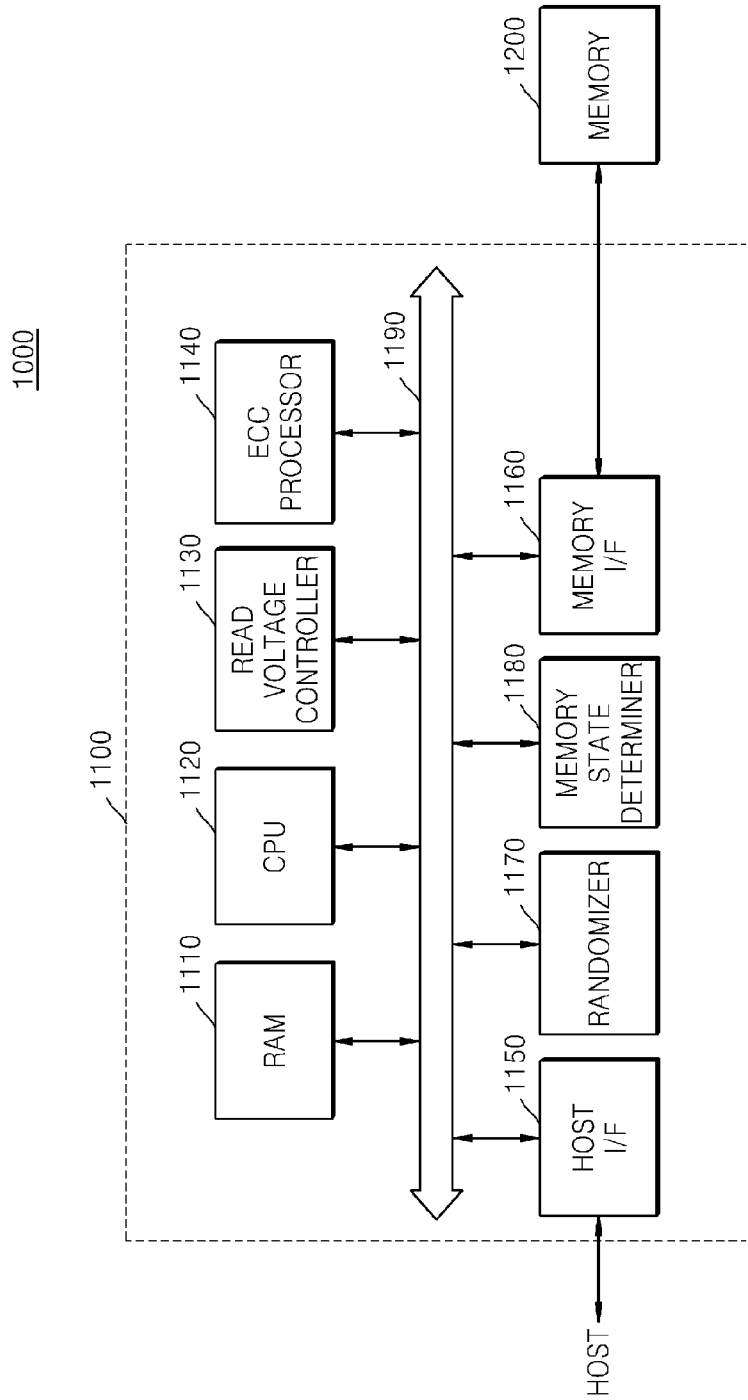
FIG. 12 is a block diagram of a memory system, according to an exemplary embodiment of the inventive concept.

FIG. 12 is a block diagram of a memory system, according to another exemplary embodiment of the inventive concept.

Referring to FIG. 12, memory system 1000 includes a memory controller 1100 and a memory device 1200.

The memory device 1200 may be a non-volatile semiconductor memory device, such as a flash memory, a PRAM, a ferroelectric RAM (FRAM), or an MRAM. Since the memory device 1200 has substantially the same components as the memory device 20 shown in FIG. 1, the description thereof will not be repeated. When the memory device 1200 is a non-volatile semiconductor memory device, such as a flash memory, the memory system 1000 may be a solid-state drive (SSD).

The memory controller 1100 controls erase operations, write operations, and read operations of the memory device 1200 in response to commands received from a host. Also, the memory controller 1100 controls read voltage applied to the memory device 1200.

The memory controller 1100 includes a RAM 1110, a central processing unit (CPU) 1120, a read voltage controller 1130, an error correction code (ECC) processor 1140, a host interface 1150, a memory interface 1160, a randomizer 1170, a memory state determiner 1180, and a bus 1190. The bus 1190 refers to a transmission path through which components of the memory controller 1100 transmit data to one another.

The CPU 1120 controls general operations of the memory system 1000. In an example, the CPU 1120 may analyze commands received from the host and control the memory system 1000 to perform operations based on analysis results.

The CPU 1120 may transmit read commands and addresses to the memory device 1200 during a read operation and transmit write commands, addresses, and data to the memory device 1200 during a write operation. Also, the CPU 1120 may convert logical addresses into physical addresses.

The CPU 1120 may control the memory system 1000 to perform operations for executing a method of determining a deterioration condition of the memory device 1200 according to various embodiments. For example, the CPU 1120 may control the memory system 1000 to perform a method of determining a deterioration condition of the memory device 1200, a method of recovering reliability, and a method of reading data according to the flowcharts shown in FIGS. 13 through 19.

Data transmitted from the host or data read from the memory device 1200 may be temporarily stored in the RAM 1110. Also, data required to control the memory system 1000, which may be read from the memory device 1200, may be stored in the RAM 1110. For example, the data required to control the memory system 1000 may include meta data. Also, the data required to control the memory system 1000 may include information regarding the first and second reference voltages V1 and V2 used for a deterioration condition determination operation of the memory device 1200 and information regarding the coefficients w1 and w2 and constant b for determining S to discriminate among deterioration conditions using Numerical expression 1. The RAM 1110 may be embodied by a dynamic RAM (DRAM) or a static RAM (SRAM), for example.

For reference, the meta data may include information required to manage the memory system 1000. The meta data including management information may include mapping information used to convert logical addresses into physical addresses of the memory device 1200.

The host interface 1150 includes a protocol configured to exchange data with the host connected to the memory system 1000 and interconnect the memory system 1000 and the host. The host interface 1150 may be embodied by an advanced technology attachment (ATA) interface, a serial advanced technology attachment (SATA) interface, a parallel advanced technology attachment (PATA) interface, a universal serial bus (USB) or serial attached small computer system (SAS) interface, a small computer system interface (SCSI), an embedded multi-media card (eMMC) interface, or a UNIX file system (UFS) interface. However, the inventive concept is not limited to the above-described examples. The host interface 1150 may exchange commands, addresses, and data with the host under the control of the CPU 1120.

The memory interface 1160 is electrically connected to the memory device 1200. The memory interface 1160 may exchange commands, addresses, and data with the memory device 1200 under the control of the CPU 1120. The memory interface 1160 may be configured to support a NAND flash memory or a NOR flash memory, for example. The memory interface 1160 may be configured to selectively perform software and hardware interleave operations through multiple channels.

The read voltage controller 1130 has substantially the same construction as and performs substantially the same operations as the read voltage controller 11 of FIG. 1. Therefore, the description thereof will not be repeated. Likewise, the memory state determiner 1180 has substantially the same configuration and performs the same operations as the memory state determiner 12 of FIG. 1, and thus the description thereof will not be repeated.

The randomizer 1170 randomizes data to be stored in the memory device 1200. For example, the randomizer 1170 may generate a sequence from seeds and randomize data to be programmed, using the generated sequence. For example, the randomizer 1170 may randomize the data to be programmed by performing a logic XOR on the sequence generated from the seeds and the data to be programmed. When the data to be programmed is randomized and stored in the memory device 1200, randomization may increase not only in a page direction of the memory device 1200 but also in a string direction thereof. Accordingly, the numbers of memory cells put into the erase state and the respective program states of the memory device 1200 may be substantially equalized.

The ECC processor 1140 performs an ECC encoding operation and an ECC decoding operation using an algorithm, such as a Reed-Solomon (RS) code, a hamming code, or a cyclic redundancy code (CRC). For example, during a write operation, the ECC processor 1140 may generate an ECC in response to data to be programmed, which is processed by the randomizer 1170, using an algorithm, such as an RS code, a hamming code, or a CRC. Also, during a read operation, the ECC processor 1140 may perform error detection and correction processes on the received data using the ECC read along with the data.

Error correction capability of the ECC processor 1140 per unit size may depend on an ECC size. For example, assuming that a 112-byte ECC size is required per 4K-byte page in an ECC algorithm for correcting bit errors in 1024-byte data to 16 bits or less, a 224-byte ECC size may be required per 4K-byte page in an ECC algorithm for correcting bit errors in 1024-byte data to 32 bits or less.

The ECC processor 1140 may be incapable of correcting errors when errors in excess of error correction capability are detected during a data read operation. In this case, the ECC processor 1140 may transmit a signal indicating an error correction failure state to the CPU 1120.

Then, the CPU 1120 may control the memory system 1000 to enter a memory state determination mode. Since an operation of determining a memory state in the memory system 1000 is described above with reference to FIG. 1, the description thereof will not be repeated.

In the memory system 1000 shown in FIG. 12, the memory state determiner 1180 is disposed in the memory controller 1000. However, according to another exemplary embodiment, the memory state determiner 1180 may be disposed in the memory device 1200.

A method of determining a deterioration condition of the memory device 1200, a method of recovering reliability, and a method of reading data, which are performed in the memory system 1000 under the control of the CPU 1120, will now be described with reference to FIGS. 13 through 19.

A method of determining a deterioration condition of the memory device 1200 in the memory system 1000 according to an exemplary embodiment of the inventive concept will now be described with reference to the flowchart of FIG. 13.

Figure 13:
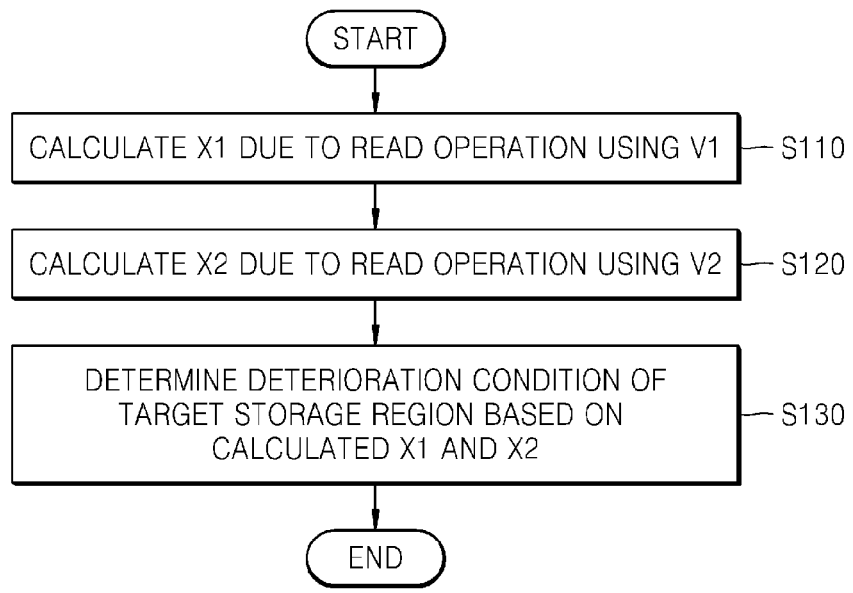
FIG. 13 is a flowchart illustrating a method of determining a deterioration condition of a memory device, according to an exemplary embodiment of the inventive concept.

Referring to FIG. 13, the CPU 1120 controls the memory system 1000 to calculate first information X1 obtained by performing a read operation using the first reference voltage V1 (operation S110). For example, the CPU 1120 may control the memory system 1000 to calculate the first information X1 by counting the number of bits having a first logic value from data obtained by performing a read operation on a target storage region of the memory device 1200 using the first reference voltage V1 as a read voltage. Since a method of determining the first reference voltage V1 is described above with reference to FIG. 1, the description thereof will not be repeated.

When an error correction failure state occurs during the read operation, a page PAGE or block BLOCK in which the error correction failure state occurs may be determined as the target storage region.

The CPU 1120 controls the memory system 1000 to calculate second information X2 obtained by performing a read operation using the second reference voltage V2 (operation S120). For example, the CPU 1120 may control the memory system 1000 to calculate the second information X2 by counting the number of bits having a second logic value from data obtained by performing a read operation on the target storage region of the memory device 1200 using the second reference voltage V2 as a read voltage. Since a method of determining the second reference voltage V2 is described above with reference to FIG. 1, the description thereof will not be repeated.

The CPU 1120 controls the memory system 1000 to determine a deterioration condition of the target storage region of the memory device 1200 based on the first and second information X1 and X2 obtained in operations S110 and S120 (operation S130). For example, the CPU 1120 may control the memory system 1000 to determine any one of a first type of deterioration condition and a second type of deterioration condition using the first and second information X1 and X2. The first type of deterioration condition may be a state in which the distribution of threshold voltages obtained in the erase state of the memory device 1200 moves toward a higher voltage, and the second type of deterioration condition may be a state in which the distribution of threshold voltages obtained in at least one program state of the memory device 1200 moves toward a lower voltage.

The embodiment shown in FIG. 13 pertains to an example in which, after operation S110 of calculating the first information X1 is performed, operation S120 of calculating the second information X2 is performed. However, in another embodiment, the order may be reversed, such that after operation S120 of calculating the second information X2 is performed, operation S110 of calculating the first information X1 is performed.

Figure 14:
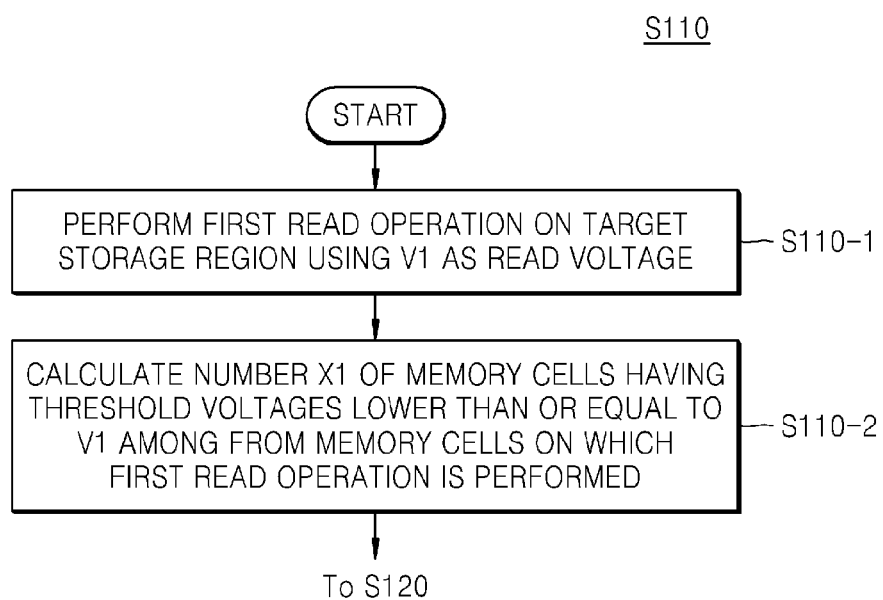
FIG. 14 is a detailed flowchart of operation S110 of calculating the first information shown in FIG. 13, according to an exemplary embodiment of the inventive concept.

FIG. 14 is a flowchart of operation S110 of calculating the first information X1 shown in FIG. 13, according to an exemplary embodiment of the inventive concept.

Referring to FIG. 14, the CPU 1120 controls the memory system 1000 to perform a first read operation on the target storage region of the memory device 1200 using the first reference voltage V1 as the read voltage (operation S110-1). In an example, the CPU 1120 may control the memory system 1000 to apply the first reference voltage V1 to a word line WL in which an error correction failure state occurs, and perform an operation of reading data.

The CPU 1120 controls the memory system 1000 to calculate the number of memory cells having threshold voltages less than or equal to the first reference voltage V1, from among memory cells on which the first read operation is performed (operation S110-2). In an example, assuming that a bit value read from memory cells having threshold voltages less than or equal to the first reference voltage V1 is "1", the CPU 1120 may count the number of bit values "1" stored in the page buffer of the memory device 1200 and calculate the first information X1.

FIG. 15 is a flowchart of operation S120 of calculating the second information X2 shown in FIG. 13, according to an exemplary embodiment of the inventive concept.

Referring to FIG. 15, the CPU 1120 controls the memory system 1000 to perform a second read operation on the target storage region of the memory device 1200 using the second reference voltage V2 as the read voltage (operation S120-1). In an example, the CPU 1120 may control the memory system 1000 to apply the second reference voltage V2 to a word line WL in which an error correction failure state occurs, and perform an operation of reading data.

The CPU 1120 controls the memory system 1000 to calculate the number of memory cells having threshold voltages higher than the second reference voltage V2, from among memory cells on which the second read operation is performed (operation S120-2). In an example, assuming that a bit value read from the memory cells having threshold voltages higher than the second reference voltage V2 is "0", the CPU 1120 may count the number of bit values "0" stored in the page buffer of the memory device 1200 and calculate the second information X2.

FIG. 16 is a detailed flowchart illustrating operation S130 of determining the deterioration condition shown in FIG. 13, according to an exemplary embodiment of the inventive concept.

Referring to FIG. 16, the CPU 1120 controls the memory system 1000 to apply the first and second information X1 and X2 determined in operations S110 and S120 to an equation established to discriminate among deterioration conditions, and solve the equation to obtain a discrimination value (operation S130-1A). In an example, the memory system 1000 may insert the first and second information X1 and X2 determined in operations S110 and S120 into an equation for discriminating between read disturbance and charge loss, which is obtained using characteristics of the distributions of the first and second information X1 and X2 experimentally measured by causing read disturbance and/or charge loss, and calculating the discrimination value by solving the equation.

In an example, an equation for discriminating among the types of deterioration condition may be obtained using a support vector machine algorithm.

The CPU 1120 may control the memory system 1000 to determine the type of deterioration condition of the target storage region of the memory device 1200 based on results obtained in operation S130-1A (operation S130-2A). In an example, it may be determined whether the target storage region of the memory device 1200 is in a read-disturbance-type deterioration condition or in a charge-loss-type deterioration condition based on the results obtained in operation S130-1A.

Figure 17:
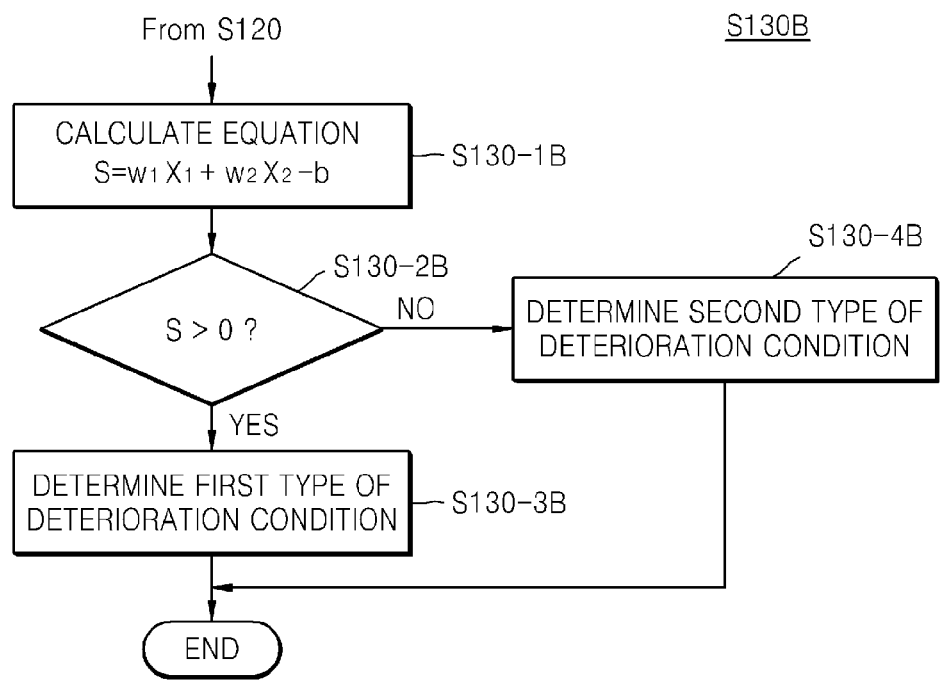
FIG. 17 is a detailed flowchart illustrating operation S130 of determining a deterioration condition shown in FIG. 13, according to an exemplary embodiment of the inventive concept.

FIG. 17 is a flowchart illustrating operation S130 of determining the deterioration condition shown in FIG. 13, according to another exemplary embodiment of the inventive concept.

Referring to FIG. 17, the CPU 1120 controls the memory system 1000 to supply the first and second information X1 and X2 determined in operations S110 and S120 to Numerical expression 1, established to discriminate among the types of deterioration condition, and to solve for a value of S (operation S130-1B). In Numerical expression 1, coefficients w1 and w2 and constant b are values by which the support vector machine algorithm is found from the distribution chart of the first and second information X1 and X2 experimentally measured by causing read disturbance and/or charge loss, and stored in the memory device 1200 or the memory controller 1100. Accordingly, by entering values stored in the memory device 1200 or the memory controller 1100 for the coefficients w1 and w2 and constant b of Numerical expression 1 and entering the first and second information X1 and X2 obtained in operations S110 and S120 for X1 and X2, the value of S may be calculated.

The CPU 1120 controls the memory system 1000 to determine whether the value S obtained in operation S130-1B is a positive (+) value (operation S130-2B). The CPU 1120 controls the memory system 1000 to determine a first type of deterioration condition when it is determined in operation S130-2B that the value S is a positive (+) value (operation S130-3B). The first type of deterioration condition may be a read-disturbance-type deterioration condition, for example. The CPU 1120 controls the memory system 1000 to determine a second type of deterioration condition when it is determined in operation S130-2B that the value S is "0" or a negative (−) value (operation S130-4B). In an example, the second type of deterioration condition may be a charge-loss-type deterioration condition.

Figure 18:
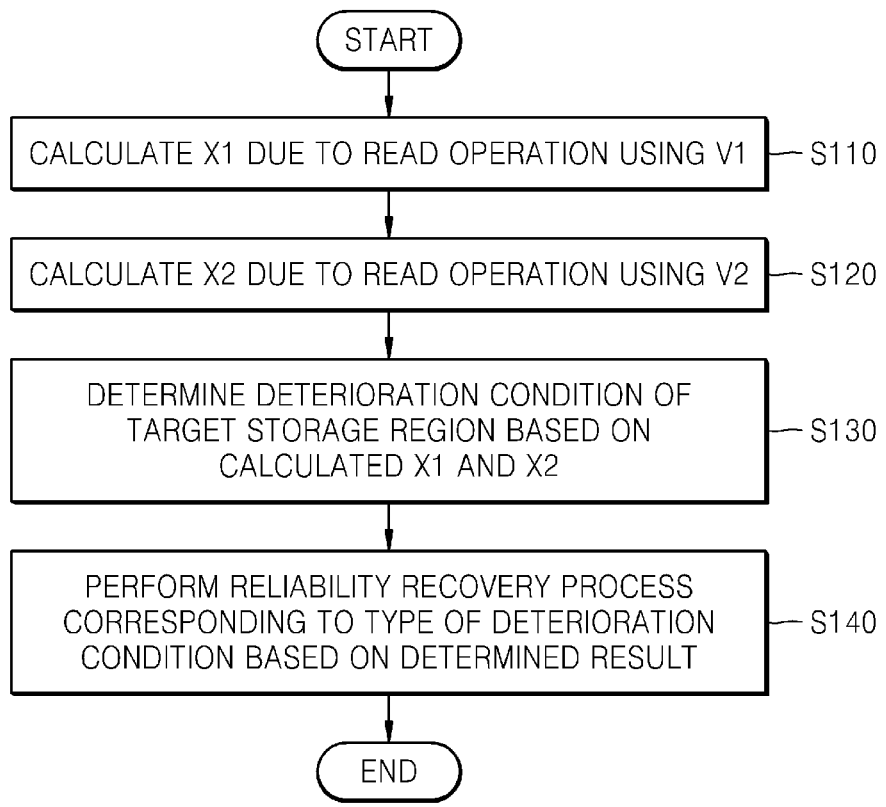
FIG. 18 is a flowchart illustrating a method of determining a deterioration condition of a memory device and recovering reliability, according to an exemplary embodiment of the inventive concept.

FIG. 18 is a flowchart illustrating a method of determining a deterioration condition of a memory device and recovering reliability, according to an exemplary embodiment of the inventive concept.

Operations S110 through S130 of FIG. 18 for determining the type of deterioration condition of the memory device are substantially the same as operations S110 through S130 of FIG. 13, and thus the descriptions thereof are not repeated.

In addition, the CPU 1120 controls the memory system 1000 to perform a reliability recovery process corresponding to the type of deterioration condition of the memory device based on the determination result obtained in operations S110 through S130 (operation S140). In an example, when the deterioration condition is determined to be a read disturbance type, the CPU 1120 controls the memory system 1000 to transfer data stored in a block of the memory device 1200, on which the memory state determination mode was performed, to another block. When the deterioration condition is determined to be a charge loss type, the CPU 1120 controls the memory system 1000 to apply an initialized program stress voltage to a word line corresponding to the storage region of the memory device 1200, on which the memory state determination mode was performed, and perform an additional program.

Figure 19:
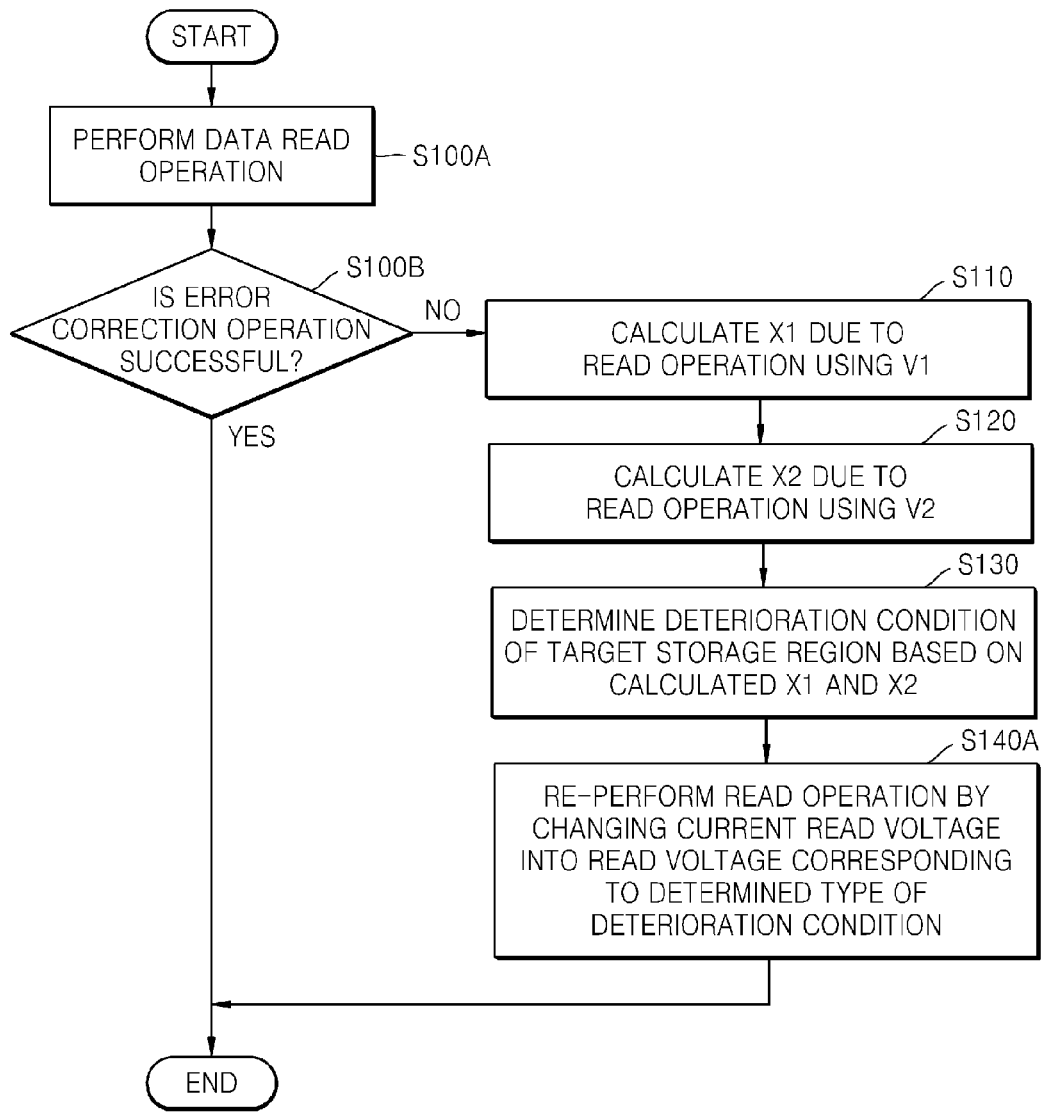
FIG. 19 is a flowchart illustrating a method of reading data, according to an exemplary embodiment of the inventive concept.

FIG. 19 is a flowchart illustrating a method of reading data, according to an exemplary embodiment of the inventive concept.

Referring to FIG. 19, the CPU 1120 controls the memory system 1000 to perform a data read operation in response to a data read request from a host (operation S100A). For example, the CPU 1120 may control the memory system 1000 to convert a logical address, from which data is requested to be read, into a physical page address and perform an ECC decoding process on data read from the physical page address.

The CPU 1120 controls the memory system 1000 to determine whether an error correction operation is successful during an ECC decoding process of the data read operation (operation S100B). The CPU 1120 may end the error correction operation when the error correction operation is successful during the ECC decoding process of the data read operation.

When the error correction operation fails during the ECC decoding process of the data read operation, the CPU 1120 controls the memory system 1000 to perform a deterioration condition determination operation on the storage region of the memory device, for which the error correction operation failed, as indicated by operations S110 to S130. Since operations S110 to S130 are substantially the same as operations S110 to S130 of FIG. 13, the description thereof will not be repeated.

The CPU 1120 then controls the memory system 1000 to change the currently set read voltage(s) to a read voltage corresponding to the type of deterioration condition of the memory device, as determined in operations S110 to S130, and to re-perform the data read operation on the storage region for which the error correction operation failed (operation S140A).

In an example, when a single-level-cell memory device 1200 is determined to be in a read-disturbance-type deterioration condition, the read voltage Vr shown in FIG. 6C may be increased. An increment in the read voltage Vr may be experimentally determined and set as an initial value.

In another example, when a 2-bit multi-level cell memory device 1200 is determined to be in a read-disturbance-type deterioration condition, the first read voltage Vr1 shown in FIG. 7C may be increased. An increment in the first read voltage Vr1 may be experimentally determined and set as an initial value.

In another example, when a 3-bit multi-level cell memory device 1200 is determined to be in a read-disturbance-type deterioration condition, the first read voltage Vr1 shown in FIG. 8C may be increased. An increment in the first read voltage Vr1 may be experimentally determined and set as an initial value.

In another example, when the single-level-cell memory device 1200 is determined to be in a charge-loss-type deterioration condition, the read voltage Vr shown in FIG. 6D may be reduced. A decrement in the read voltage Vr may be experimentally determined and set as an initial value.

In another example, when the 2-bit multi-level-cell memory device 1200 is determined to be in a charge-loss-type deterioration condition, the third read voltage Vr3 shown in FIG. 7D may be reduced. A decrement in the third read voltage Vr3 may be experimentally determined and set as an initial value. Also, the first and second read voltages Vr1 and Vr2 may be reduced. Each of the decrements of the first and second read voltages Vr1 and Vr2 may be determined to be less than the decrement in the third read voltage Vr3.

In another example, when the 3-bit multi-level-cell memory device 1200 is determined to be in a charge-loss-type deterioration condition, the seventh read voltage Vr7 shown in FIG. 8D may be reduced. A decrement in the seventh read voltage Vr7 may be experimentally determined and set as an initial value. Also, the first through sixth read voltages Vr1 to Vr6 may be reduced. Each of the first through sixth read voltages Vr1 to Vr6 may be determined to be less than the decrement in the seventh read voltage Vr7.

The above-described embodiments pertain to examples in which a read disturbance type is distinguished from a charge loss type, but the inventive concept is not limited thereto and may be applied to discriminate among various types of deterioration conditions. For example, a distribution chart may be obtained by measuring first and second information regarding the types of deterioration conditions to be distinguished. Thereafter, an equation for discriminating among the types of deterioration condition may be obtained from the distribution chart using a support vector machine algorithm. Thus, various types of deterioration condition may be distinguished using the obtained equation.

Figure 22:
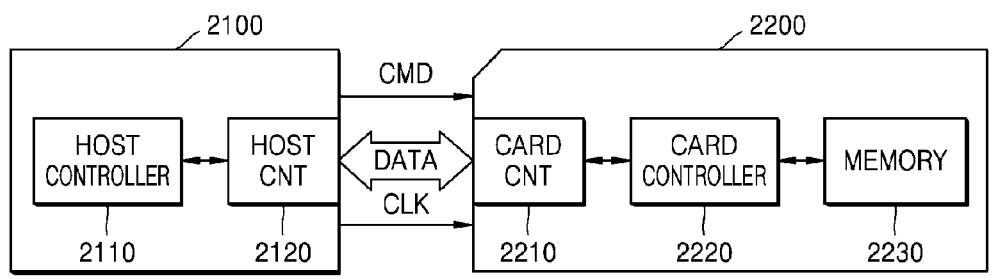
FIG. 22 is a block diagram of an example in which a memory system according to exemplary embodiments of the inventive concept is applied to a memory card.

FIG. 22 is a block diagram of an example in which a memory system according to exemplary embodiments of the inventive concept is applied to a memory card.

Referring to FIG. 22, a memory card system 2000 includes a host 2100 and a memory card 2200. The host 2100 includes a host controller 2110 and a host connector 2120. The memory card 2200 includes a card connector 2210, a card controller 2220, and a memory device 2230.

The host 2100 writes data in the memory card 2200 or reads stored data from the memory card 2200. The host controller 2110 may transmit commands CMD, clock signals CLK generated by a clock generator (not shown) included in the host 2100, and data DATA to the memory card 2200 through the host connector 2120.

The card controller 2220 stores data in the memory device 2230 in synchronization with clock signals generated by a clock generator (not shown) included in the card controller 2220, in response to commands received through the card connector 2210. The memory device 2230 stores data transmitted from the host 2100. In this case, the card controller 2220 or the memory device 2230 may include the memory state determiner described above with reference to FIGS. 1 through 12.

The memory card 2200 may be a compact flash card (CFC), a Microdrive, a smart media card (SMC), a multimedia card (MMC), a security digital card (SDC), a memory stick, or a USB flash memory driver, for example.

Figure 23:
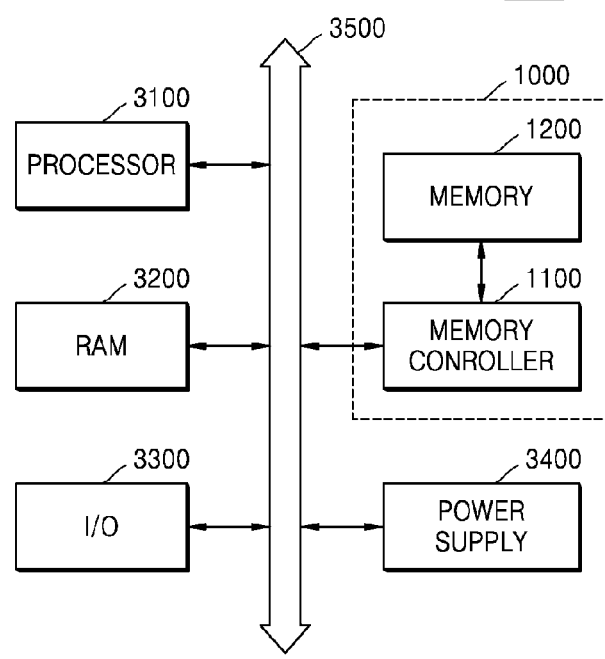
FIG. 23 is a block diagram of a computing system including a memory system according to an exemplary embodiment of the inventive concept.

FIG. 23 is a block diagram of a computing system including a memory system, according to an exemplary embodiment of the inventive concept.

Referring to FIG. 23, computing system 3000 includes a processor 3100, a RAM 3200, an I/O device 3300, a power supply 3400, and a memory system 1000. Although not shown in FIG. 23, the computing system 3000 may further include ports capable of communicating with a video card, a sound card, a memory card, and a USB apparatus or communicating with other electronic devices. The computing system 3000 may be embodied by a personal computer (PC) or a portable electronic device, such as a laptop computer, a portable phone, a personal digital assistant (PDA), or a camera, for example.

The processor 3100 performs specific calculations or tasks. In some embodiments, the processor 3100 may be a microprocessor (MP) or a central processing unit (CPU). The processor 3100 may communicate data or signals with the RAM 3200, the I/O device 3300, and the memory system 1000 through a bus 3500, such as an address bus, a control bus, and a data bus, for example. In some embodiments, the processor 3100 may be connected to an expansion bus, such as a peripheral computer interconnect (PCI) bus.

The RAM 3200 stores data required for an operation of the computing system 3000. For example, the RAM 3200 may be embodied by a DRAM, a mobile DRAM, an SRAM, a PRAM, an FRAM, an RRAM, and/or an MRAM.

The I/O device 3300 may include an input unit, such as a keyboard, a keypad, or a mouse, and an output unit, such as a printer or a display unit. The power supply 3400 may supply an operating voltage required for the operation of the computing system 3000.

Figure 24:
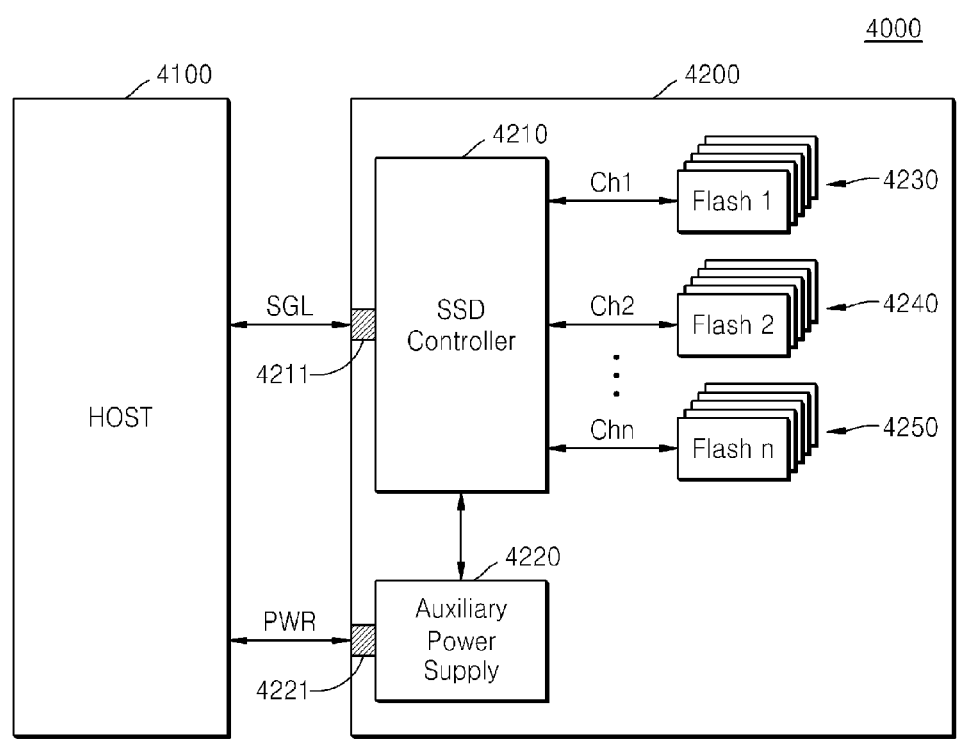
FIG. 24 is a block diagram of an example in which a memory system, according to an exemplary embodiment of the inventive concept, is applied to a solid-state drive (SSD)

FIG. 24 is a block diagram of an example in which a memory system, according to an exemplary embodiment of the inventive concept is applied to an SSD.

Referring to FIG. 24, an SSD system 4000 includes a host 4100 and an SSD 4200. The SSD 4200 transmits/receives signals to/from the host 4100 through a signal connector 4211 and receives power through a power connector 4221. The SSD 4200 includes an SSD controller 4210, an auxiliary power supply 4220, and a plurality of memory devices 4230, 4240, and 4250. In this case, the SSD controller 4210 or the memory devices 4230, 4240, and 4350 may include the memory state determiner described above with reference to FIGS. 1 through 12.

Figure 25:
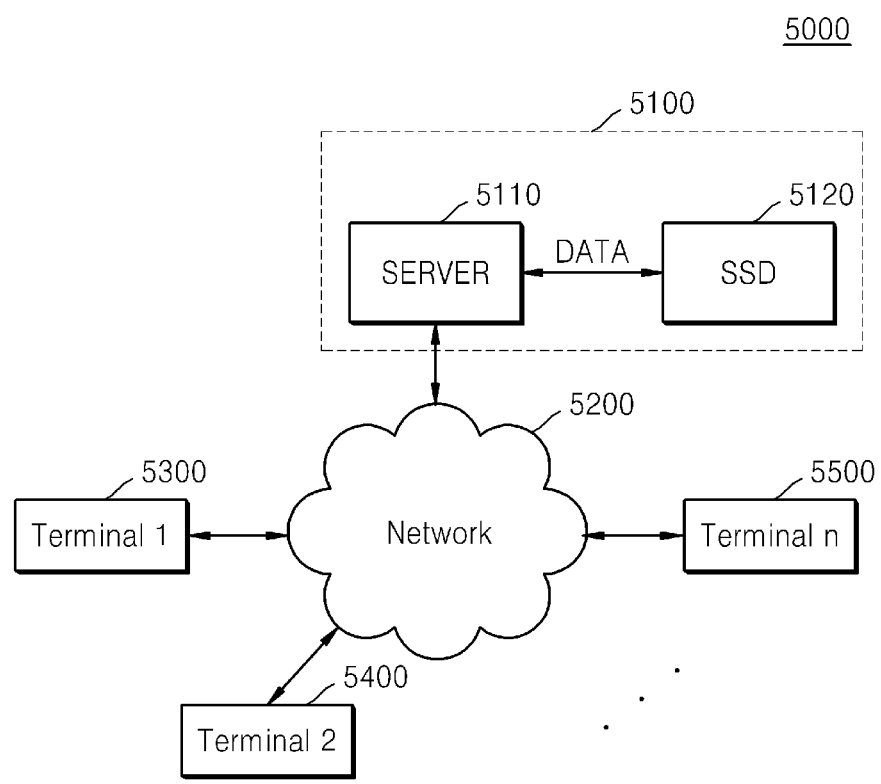
FIG. 25 is a block diagram of a server system and a network system including the SSD of FIG. 24.

FIG. 25 is a block diagram of a server system and a network system including the SSD of FIG. 24, according to an exemplary embodiment of the inventive concept is applied to an SSD.

Referring to FIG. 25, network system 5000 includes a server system 5100 and a plurality of terminals 5300, 5400, and 5500 connected via a network 5200. The server system 5100 includes a server 5110 configured to process requests received from the terminals 5300, 5400, and 5500 connected to the network 5200 and an SSD 5120 configured to store data corresponding to the requests received from the terminals 5300, 5400, and 5500. In this case, the SSD 5120 may be the SSD 4000 of FIG. 24, for example.

The above-described flash memory system according to embodiments the inventive concept may be mounted using semiconductor packages having various shapes. For example, the memory system may be packaged using a Package on Package (PoP) technique, a ball grid array (BGA) technique, a chip-scale package (CSP) technique, a plastic-leaded chip carrier (PLCC) technique, a plastic dual in-line package (PDIP) technique, a die-in-waffle-pack technique, a die-in-wafer-form technique, a chip-on-board (COB) technique, a ceramic dual in-line package (CERDIP) technique, a plastic metric quad flat pack (MQFP) technique, a thin quad flat pack (TQFP) technique, a small outline (SOIC) technique, a shrink small outline package (SSOP) technique, a thin small outline (TSOP) technique, a thin quad flat pack (TQFP) technique, a system-in-package (SIP) technique, a multi-chip package (MCP) technique, a wafer-level fabricated package (WFP) technique, or a wafer-level processed stack package (WSP) technique.

While the inventive concept has been described with reference to illustrative embodiments, it will be apparent to those skilled in the art that various changes and modifications may be made without departing from the spirit and scope of the present inventive concept. Therefore, it should be understood that the above embodiments are not limiting, but illustrative.

What is claimed is:

1. A method of determining a deterioration condition of a memory device, the method comprising:
   calculating first information corresponding to a number of bits having a first logic value from data obtained by performing a first read operation on a target storage region of the memory device using a first reference voltage as a read voltage;
   calculating second information corresponding to a number of bits having a second logic value, from data obtained by performing a second read operation on the target storage region of the memory device using a second reference voltage as the read voltage; and
   determining a deterioration condition of the target storage region of the memory device based on the calculated first information and the calculated second information,
   wherein the first reference voltage is less than a first read voltage by which an erase state of the memory device is distinguished from a program state adjacent to the erase state, and the second reference voltage is higher than the first read voltage, and
   wherein determining of the deterioration condition comprises:
   applying the calculated first information and the calculated second information to a predetermined equation and performing a calculation process; and
   determining the type of deterioration condition of the target storage region of the memory device based on a result of the calculation process,
   wherein the predetermined equation is obtained to discriminate among the plurality of types of deterioration conditions based on a distribution of experimentally measured first information and experimentally measured second information.

2. The method of claim 1, wherein calculating the first information comprises:
   performing the first read operation on the target storage region using the first reference voltage as the read voltage; and
   calculating a number of memory cells having threshold voltages less than or equal to the first reference voltage among memory cells of the target storage region on which the first read operation is performed.

3. The method of claim 1, wherein calculating the second information comprises:
   performing the second read operation on the target storage region using the second reference voltage as the read voltage; and
   calculating a number of memory cells having threshold voltages higher than the second reference voltage among memory cells of the target storage region on which the second read operation is performed.

4. The method of claim 1, wherein, based on distribution of initial threshold voltages of memory cells of the memory device, the first reference voltage is determined to be a median value of a distribution of threshold voltages obtained in the erase state, and the second reference voltage is determined to be a median value of a distribution of threshold voltages obtained in a program state having a highest threshold voltage from among a plurality of program states.

5. The method of claim 1, wherein the predetermined equation is obtained to discriminate a first type of deterioration condition, in which a distribution of threshold voltages obtained in the erase state of the memory device moves toward a higher voltage, from a second type of deterioration condition, in which a distribution of threshold voltages obtained in at least one program state of the memory device moves toward a lower voltage.

6. The method of claim 5, wherein the second type of deterioration condition includes a deterioration condition in which a distribution of threshold voltages obtained in a program state having a highest threshold voltage, from among a plurality of program states of the memory device including multi-level cells, moves toward the lower voltage.

7. The method of claim 1, wherein the predetermined equation is obtained to discriminate among types of deterioration conditions based on a support vector machine algorithm in a distribution chart of the experimentally measured first information and the experimentally measured second information.

8. The method of claim 7, wherein the predetermined equation uses the experimentally measured first information and the experimentally measured second information as respective variables and discriminates among at least two types of deterioration conditions based on the experimentally measured first information and the experimentally measured second information.

9. The method of claim 1, wherein the target storage region of the memory device includes a storage region that has failed in correcting errors during a data read process.

10. A memory system comprising:
a memory device including memory cells having an erase state and at least one program state; and
a memory controller configured to apply each of a first reference voltage and a second reference voltage as a read voltage and to determine a type of deterioration condition of a target storage region of the memory device based on a number of bits having a first logic value and a number of bits having a second logic value that are included in data read from the target storage region of the memory device,
wherein the applied first reference voltage is set less than a first read voltage for discriminating between the erase state and a program state adjacent to the erase state, and the second reference voltage is set higher than the first read voltage, and
wherein the memory controller comprises:
a read voltage controller configured to determine usage of the first reference voltage or the second reference voltage as the read voltage under initialized conditions and to apply the read voltage to the memory device; and
a memory state determiner configured to determine the type of the deterioration condition of the target storage region of the memory device based on the number of bits having the first logic value included in data read from the target storage region using the first reference voltage, and the number of bits having the second logic value included in data read from the target storage region using the second reference voltage.

11. The memory system of claim 10, wherein the memory state determiner comprises:
a first counter configured to count the number of the bits having the first logic value included in the data read from the target storage region when applying the first reference voltage as the read voltage;
a second counter configured to count the number of the bits having the second logic value included in the data read from the target storage region when applying the second reference voltage as the read voltage;
a calculator configured to apply first information obtained by the first counter and second information obtained by the second counter and to solve a predetermined equation, initialized to discriminate among types of deterioration conditions of the memory device, using the first information and the second information; and
a deterioration type determiner configured to determine the type of deterioration condition of the target storage region based on the solution obtained by the calculator.

12. The memory system of claim 10, wherein the memory controller performs a reliability recovery process corresponding to the determined type of deterioration condition of the target storage region of the memory device.

13. The memory system of claim 12, wherein the reliability recovery process comprises transferring data stored in the target storage region of the memory device to another storage region of the memory device when the determined type of deterioration condition is a state in which a distribution of threshold voltages obtained in the erase state moves toward a higher voltage, and
the reliability recovery process comprises applying an initialized program stress voltage to a word line corresponding to the target storage region of the memory device when the determined type of deterioration condition is a state in which a distribution of threshold voltages obtained in a program state of the target storage region of the memory device moves toward a lower voltage.

14. A method of determining a deterioration condition of a memory device, the method comprising:
performing a first read operation on a target storage region of the memory device using a first reference voltage as a read voltage, the first reference voltage being less than a first read voltage required to distinguish an erase state of the memory device from a program state adjacent to the erase state;
counting a number of bits having a first logic value from the first read operation to determine first information;
performing a second read operation on the target storage region of the memory device using a second reference voltage as the read voltage, the second reference voltage being higher than the first read voltage;
counting a number of bits having a second logic value from the second read operation to determine second information;
applying the first and second information to a predetermined equation and solving the predetermined equation to determine a deterioration condition of the target storage region of the memory device;
when the solution of the predetermined equation is positive, determining that the deterioration condition of the target storage region is a read-disturbance-type deterioration condition, and
when the solution of the predetermined equation is negative, determining that the deterioration condition of the target storage region is a charge-loss-type deterioration condition.

15. The method of claim 14, further comprising:
performing a reliability recovery process corresponding to the determined type of deterioration condition of the target storage region of the memory device.

16. The method of claim 15, wherein the reliability recovery process comprises transferring data stored in the target storage region of the memory device to another storage region of the memory device when the deterioration condition of the target storage region is a read-disturbance-type deterioration condition.

17. The method of claim 15, wherein the reliability recovery process comprises applying an initialized program stress voltage to a word line corresponding to the target storage region of the memory device when the deterioration condition of the target storage region is a charge-loss-type deterioration condition.

* * * * *